US012795902B2

(12) United States Patent
Benson et al.

(10) Patent No.: US 12,795,902 B2
(45) Date of Patent: Nov. 10, 2026

(54) MEMORY ARRAY—PERIPHERY INTEGRATION WITH SPLIT BARRIER METAL STACK

(71) Applicant: Micron Technology, Inc., Boise, ID (US)

(72) Inventors: Russell Allen Benson, Boise, ID (US); Shivani Srivastava, Boise, ID (US); Jaydip Guha, Boise, ID (US); Raghunath Singanamalla, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 351 days.

(21) Appl. No.: 18/236,579

(22) Filed: Aug. 22, 2023

(65) Prior Publication Data

US 2024/0074161 A1 Feb. 29, 2024

Related U.S. Application Data

(60) Provisional application No. 63/401,945, filed on Aug. 29, 2022.

(51) Int. Cl.
*H10B 12/00* (2023.01)

(52) U.S. Cl.
CPC ........... *H10B 12/485* (2023.02); *H10B 12/05* (2023.02); *H10B 12/482* (2023.02)

(58) Field of Classification Search
CPC .... H10B 12/05; H10B 12/482; H10B 12/485; H10B 12/488
See application file for complete search history.

(56) References Cited

U.S. PATENT DOCUMENTS

| | | | | |
|---|---|---|---|---|
| 5,162,884 | A | 11/1992 | Liou | |
| 2006/0017110 | A1 | 1/2006 | Adetutu et al. | |
| 2008/0273410 | A1 | 11/2008 | Goswami | |
| 2012/0070944 | A1 | 3/2012 | Kim et al. | |
| 2016/0027795 | A1 * | 1/2016 | Jung ...................... | H10B 43/27 257/326 |

(Continued)

FOREIGN PATENT DOCUMENTS

| | | | |
|---|---|---|---|
| CN | 117641905 | A | 3/2024 |
| CN | 117641906 | A | 3/2024 |
| KR | 20110025472 | A | 3/2011 |

*Primary Examiner* — Hoai V Pham
(74) *Attorney, Agent, or Firm* — Schwegman Lundberg & Woessner, P.A.

(57) ABSTRACT

A variety of applications can include apparatus having a memory device with digit line contacts disposed in a dielectric and metal digit lines coupled to various of the digit line contacts by at most one metal barrier above the dielectric. Material of the metal digit lines is used as a contact metal to a transistor in a periphery to the memory array region, where the transistor is coupled to the metal contact by multiple barrier metals on polysilicon on the transistor. An integration flow of metallization for periphery devices to a memory array and digit lines can be implemented to allow separate barrier metal formation between the memory array and the periphery, while still using the same material as the main conductor. Barrier metals can be formed for the periphery and the memory array region and then cleared from the memory array region before forming the main conductor.

11 Claims, 26 Drawing Sheets

(56) References Cited

U.S. PATENT DOCUMENTS

| | | | | |
|---|---|---|---|---|
| 2019/0027487 | A1 | 1/2019 | Chen et al. | |
| 2019/0206874 | A1 | 7/2019 | Wang et al. | |
| 2020/0185396 | A1 | 6/2020 | Juengling | |
| 2021/0043579 | A1 | 2/2021 | Fumagalli et al. | |
| 2022/0093639 | A1 * | 3/2022 | Song ...................... | H10B 41/50 |
| 2022/0122992 | A1 | 4/2022 | Chen et al. | |
| 2024/0074159 | A1 | 2/2024 | Srivastava et al. | |
| 2024/0074160 | A1 | 2/2024 | Srivastava et al. | |
| 2024/0074166 | A1 | 2/2024 | Srivastava et al. | |

* cited by examiner

MEMORY ARRAY—PERIPHERY INTEGRATION WITH SPLIT BARRIER METAL STACK

PRIORITY APPLICATION

This application claims the benefit of priority to U.S. Provisional Application Ser. No. 63/401,945, filed Aug. 29, 2022, which is incorporated herein by reference in its entirety.

FIELD OF THE DISCLOSURE

Embodiments of the disclosure relate generally to memory systems, and more specifically, to memory devices and formation thereof.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), static RAM (SRAM), or synchronous dynamic random-access memory (SDRAM), among others. Non-volatile memory can retain stored data when not powered, and includes flash memory, read-only memory (ROM), electrically erasable programmable ROM (EEPROM), erasable programmable ROM (EPROM), resistance variable memory, such as phase-change random-access memory (PCRAM), resistive random-access memory (RRAM), magnetoresistive random-access memory (MRAM), or three-dimensional (3D) XPoint™ memory, among others. Properties of memory devices can be improved by enhancements to the design and fabrication of components of the memory devices.

BRIEF DESCRIPTION OF THE DRAWINGS

The drawings, which are not necessarily drawn to scale, illustrate generally, by way of example, but not by way of limitation, various embodiments discussed in the present document.

DETAILED DESCRIPTION

Figure 1:
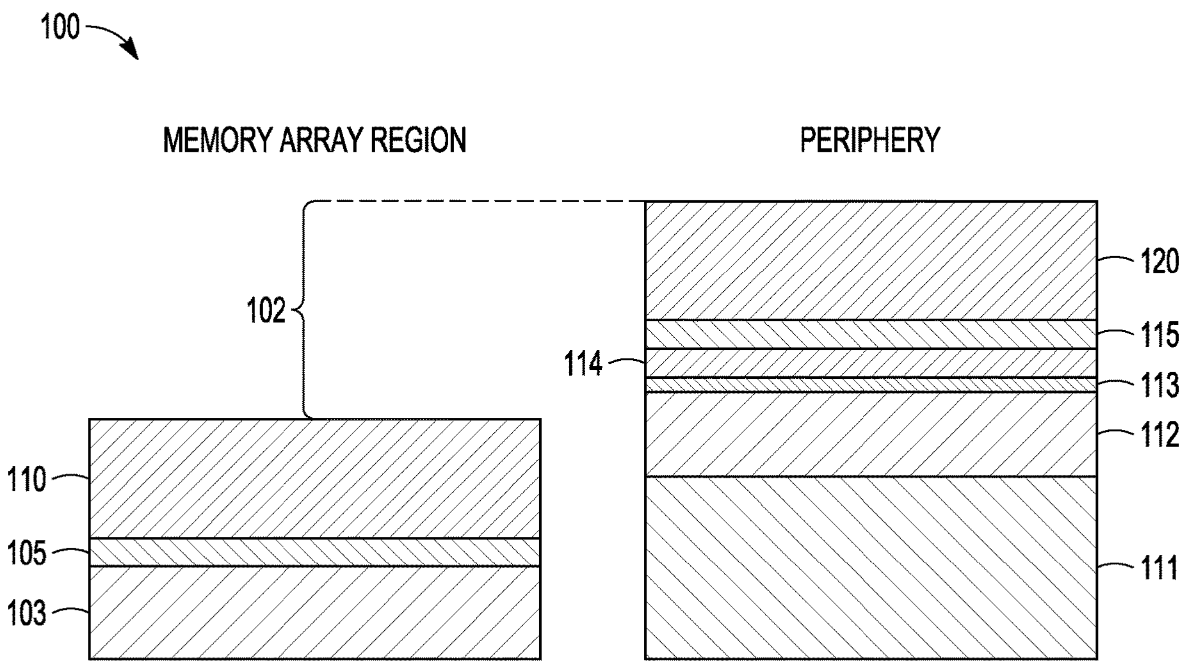
FIG. 1 illustrates portions of an architecture of a memory device having a memory array region and a periphery to the memory array after common processing of a metal digit line in the memory array region and metal contact in the periphery, according to various embodiments.

The following detailed description refers to the accompanying drawings that show, by way of illustration, various embodiments that can be implemented. These embodiments are described in sufficient detail to enable those of ordinary skill in the art to practice these and other embodiments. Other embodiments may be utilized, and structural, logical, mechanical, and electrical changes may be made to these embodiments. The term "horizontal" as used in this application is defined as a plane parallel to a conventional plane or surface of a wafer or substrate, regardless of the orientation of the wafer or substrate. The term "vertical" refers to a direction perpendicular to the horizontal as defined above. Various features can have a vertical component to the direction of their structure. The various embodiments are not necessarily mutually exclusive, as some embodiments can be combined with one or more other embodiments to form new embodiments. The following detailed description is, therefore, not to be taken in a limiting sense.

Traditional process flows for memory devices, such as DRAMs, utilize the same metallization for complementary metal-oxide-semiconductor (CMOS) devices in the periphery to a memory array and a memory array digit line in the memory array region. The same metallization, for example, can consist of barrier metals to a main conductor, where the barrier metals are designed for both CMOS devices in the periphery and the memory array. The same metallization used in traditional process flows for DRAMs in the periphery to a memory array and the memory array digit line can consist, for example, of barrier metal to a main conductor of tungsten (W), where the barrier metal includes titanium (Ti)/tungsten nitride (WN)/tungsten silicide ($WSi_X$). With respect to the barrier metal, Ti can form a titanium silicide ($TiSi_X$) layer with underlying polycrystalline silicon (polysilicon), while WN protects against Ti outdiffusion to the $WSi_X$ and W layers. The $WSi_X$ serves as a template for W to form low resistivity scaling. As DRAM scales to future designs, structural characteristics between array and periphery may no longer the same. For example, some designs are moving to a metal digit line contact from polysilicon in the memory array region. As such, use of the Ti and WN barrier metals in the memory array may no longer part of such designs, where inclusion of Ti and WN barrier metals can have a negative impact on digit line capacitance. Properties of the DRAM can be improved by enhancements to the design and fabrication of the barrier metals.

In various embodiments, to optimize metallization for periphery devices to a memory array and digit lines, separate barrier metals between the memory array region and the periphery can be run, allowing separate optimization of the memory array and periphery. Periphery devices, such as CMOS devices, can include transistors used with the memory array. An integration flow can be implemented to allow separate barrier metal formation between the memory array and the periphery, while still using the same material, such as but not limited to W, as the main conductor. Barrier metals can be formed for the periphery and the memory array region and then cleared from the memory array region before forming the main conductor. Prior to the main conductor deposition, any barrier metals in common between the memory array and periphery, such as but not limited to $WSi_X$, can be added. Reduction of barrier metal to digit lines in a memory array can lower digit line capacitance.

FIG. 1 illustrates portions of an architecture 100 of a memory device having a memory array region and a periphery to the memory array after common processing of a metal digit line 110 in the memory array region and metal contact 120 in the periphery. The metal contact 120 can be a metal contact to a transistor, such as but not limited to a transistor in a CMOS device, in the periphery. The metal digit line 110 is separated from a dielectric 103 by a single metal barrier 105 in the memory array region, while the metal contact 120 is separated from a polysilicon region 112 by three metal barriers 115, 114, and 113. Polysilicon region 112 is located on a gate 111, where gate 111 can be a high-k metal gate (HKMG) of a transistor, which transistor can be, but is not limited to, a p-channel MOS of a CMOS device. A HKMG is a gate comprising a metal located on a high-k dielectric, where a high-k dielectric is a dielectric having a dielectric constant greater than that of silicon dioxide. The high-k dielectric can be located on a thin layer of silicon oxide.

In a non-limiting example, architecture 100 can include the periphery structure with W used as metal contact 120, $WSi_X$ used as metal barrier 115, WN used as metal barrier 114, and Ti used as metal barrier 113. Gate 111 can be a HKMG. The memory array region of architecture 100 can include W used as metal digit line 110 and $WSi_X$ used as metal barrier 105. There is a step height 102 between a top level of metal digit line 110 in the memory array region and a top level of metal contact 120 in the periphery. With metal digit line 110 having a height of 14 nm, metal barrier 105 having a height of 3 nm, and dielectric 103 having a height of 10 nm in the memory array region; and with metal contact 120 having a height of 14 nm, metal barrier 115 having a height of 3 nm, metal barrier 114 having a height of 3 nm, metal barrier 113 having a height of 2 nm, polysilicon region 112 having a height of 9 nm, and gate 111 having a height of 19 nm; the step height 102 is 23 nm. In some conventional architectures and processing, with a metal digit line and its barrier metals in the memory array region and the metal contact and its barrier metals in the periphery, the step height is less since the conventional processing forms the metal barriers in the memory array region and the periphery to be the same. Though the smaller step height between the memory array region and the periphery in a conventional approach has some benefits, the larger step height of architecture 100 due to the reduced number of metal barriers can provide enhanced capacitance properties for the memory device having architecture 100.

Metal digit line 110, which with metal barrier 105 runs on at the top level of and along dielectric 103, is one of a number of digit lines on dielectric 103. With digit lines running parallel on dielectric 103, there is a digit line capacitance between digit lines. Architecture 100 provides for reduced digit line capacitance, relative to a conventional architecture, due to the reduced height of the combination of metal digit line 110 and metal barrier 105 provided by limiting the number of metal barriers between metal digit line 110 and dielectric 103 to one metal barrier.

Figure 2:
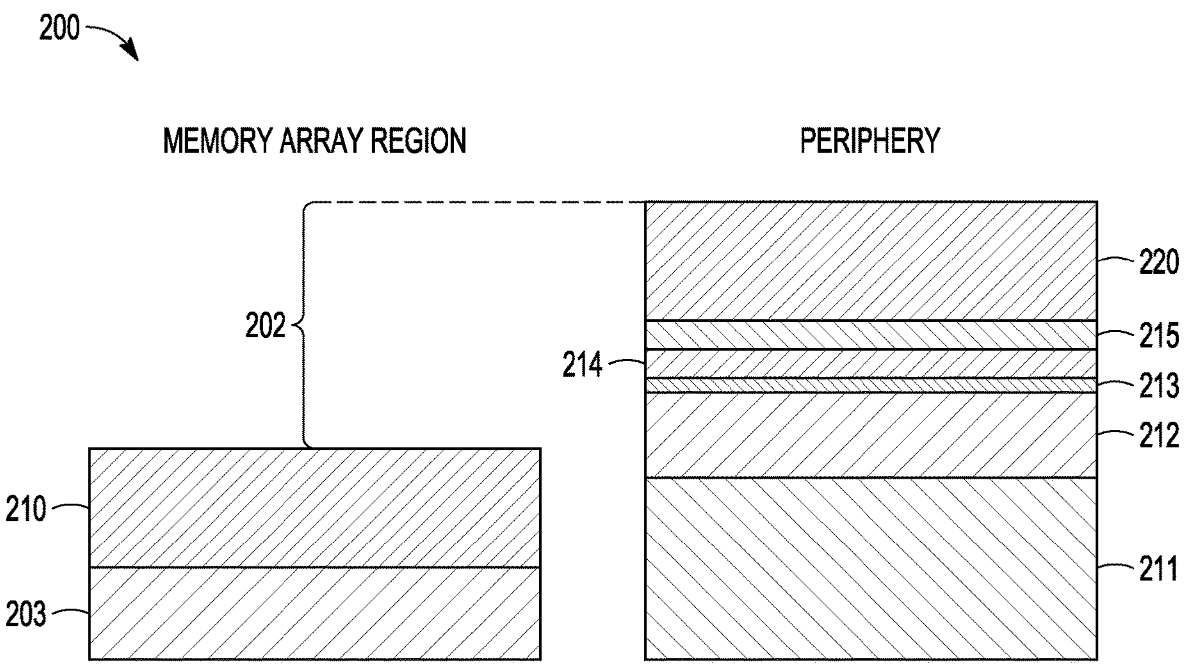
FIG. 2 illustrates portions of another architecture of a memory device having a memory array region and a periphery to the memory array after common processing of a metal digit line in the memory array region and metal contact in the periphery, according to various embodiments.

FIG. 2 illustrates an architecture 200 of a memory device having a memory array region and a periphery to the memory array after common processing of a metal digit line 210 in the memory array region and metal contact 220 in the periphery. The metal contact 220 can be a metal contact to a transistor, such as but not limited to a transistor in a CMOS device, in the periphery. The metal digit line 210 is located directly on a dielectric 203 and is not separated from dielectric 203 by any metal barrier in the memory array region, while the metal contact 220 is separated from a polysilicon region 212, which is located on a gate 211, by three metal barriers 215, 214, and 213. Gate 211 can be a HKMG of a transistor, which transistor can be, but not limited to, a p-channel MOS of a CMOS device. The high-k dielectric can be located on a thin layer of silicon oxide.

In a non-limiting example, architecture 200 can include the periphery structure with W used as metal contact 220, $WSi_X$ used as metal barrier 215, WN used as metal barrier 214, and Ti used as metal barrier 213. Gate 211 can be a HKMG. The memory array region of architecture 200 can include W used as metal digit line 210. There is a step height 202 between a top level of metal digit line 210 in the memory array region and a top level of metal contact 220. With metal digit line 210 having a height of 14 nm and dielectric 203 having a height of 10 nm in the memory array region; and with metal contact 220 having a height of 14 nm, metal barrier 215 having a height of 3 nm, metal barrier 214 having a height of 3 nm, metal barrier 213 having a height of 2 nm, polysilicon region 212 having a height of 9 nm and gate 211 having a height of 19 nm; the step height 102 is 26 nm. As previously noted, in some conventional processing, with a metal digit line and its barrier metals in the memory array region and the metal contact and its barrier metals in the periphery, the step height is less since the conventional processing forms the metal barriers in the memory array region and the periphery to be the same. Though the smaller step height between the memory array region and the periphery in a conventional approach has some benefits, the larger step height of architecture 200 due to having no metal barriers can provide enhanced capacitance properties.

Metal digit line 210 runs on the top level of and along dielectric 203 and is one of a number of digit lines on dielectric 203. With digit lines running parallel on dielectric 203, there is a digit line capacitance between digit lines. Architecture 200 provides for reduced digit line capacitance, relative to a conventional architecture, due to the reduced height of metal digit line 210 on dielectric 203 provided by directly placing metal digit line 210 on dielectric 203.

FIGS. 3-14 illustrate an embodiment of an example process flow of forming a metal conductive region to a memory array region of a memory device and to a periphery of the memory array region of a memory device, where barrier stacks are split between the memory array region and the periphery. This process flow provides a single metal barrier connecting a digit line to a digit line contact, with the single metal barrier at the top level of the dielectric on which digit lines are routed in the memory array region of the memory device. This process flow also provides a metal contact to a transistor in the periphery with multiple metal barriers between the metal contact and a gate of the transistor.

Figure 3:
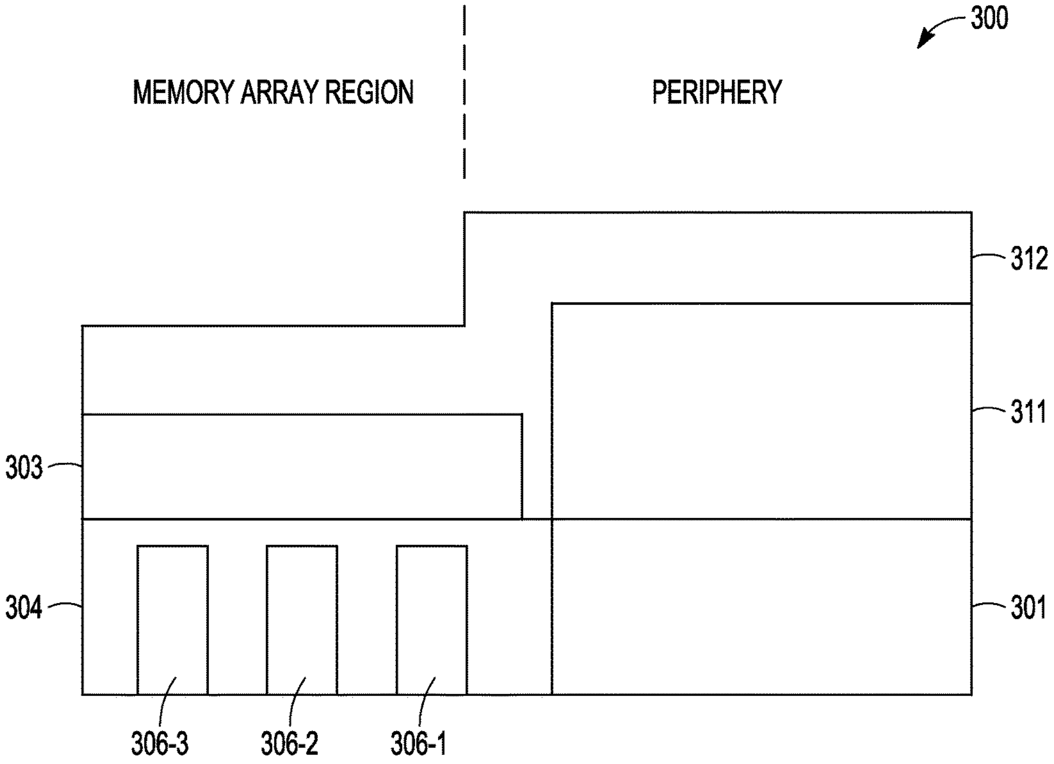
FIGS. 3-14 illustrate an example process flow for forming a metal conductive region to a memory array region of a memory device and to a periphery to the memory array region of a memory device, where barrier stacks are split between the memory array region and the periphery, according to various embodiments.

FIG. 3 illustrates a cross-sectional view of a structure 300 of a memory device having a memory array region and a periphery. Memory array region includes a polysilicon region 312 on an interlayer dielectric (ILD) 303 placed on another ILD 304, in which silicon regions 306-3, 306-2, and 306-1 are located. Though three silicon regions are shown, more or less than three silicon regions can be formed. For a memory array, such silicon regions can be significantly more in number than three. ILD 303 can include silicon oxide, such as $SiO_2$, silicon nitride, such as $Si_3N_4$, or other appropriate dielectric material. Polysilicon region 312 has also been formed in the periphery on a gate 311. Gate 311 can be a HKMG on a substrate region 301, which can be a silicon substrate region. Example heights for components of structure 300 can include, but are not limited to, polysilicon 310 having a height of 5-15 nm, ILD 303 having a height of 5-20 nm, and gate 311 having a height of 15-25 nm. Polysilicon region 312 will only remain in the periphery at the completion of the process flow associated with FIGS. 3-14. Structure 300 provides a starting structure for this process flow.

Figure 4:
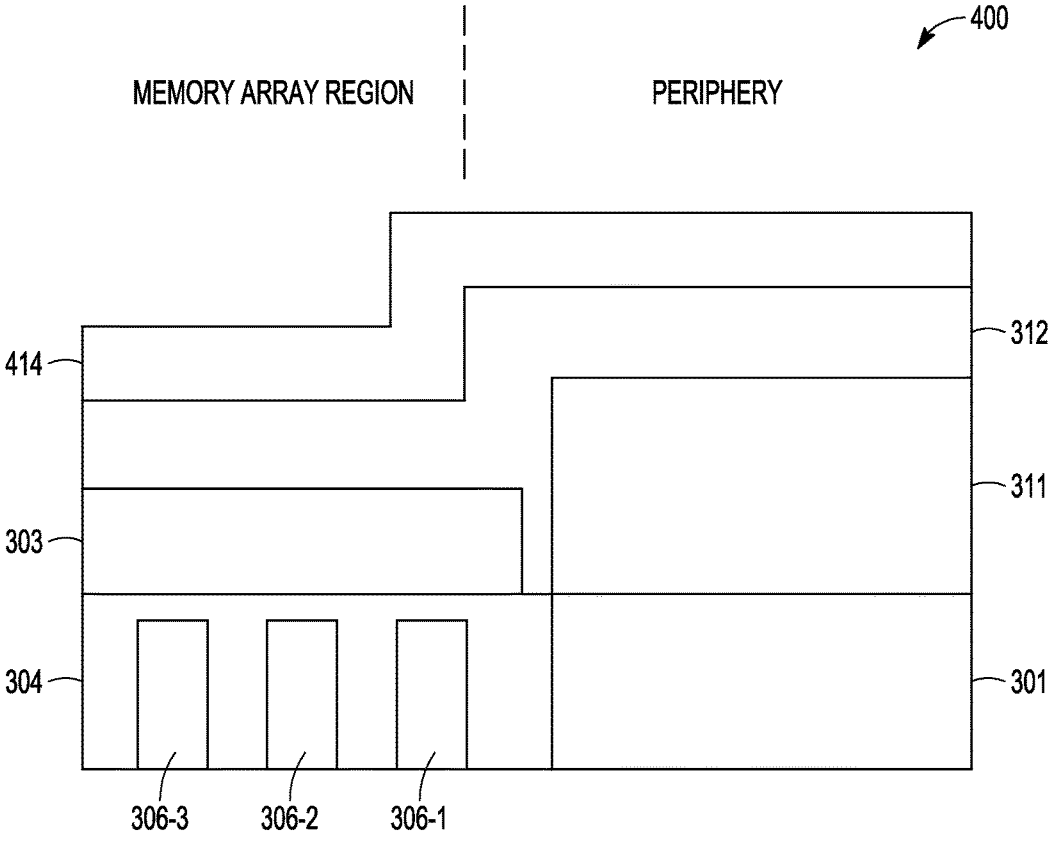

FIG. 4 illustrates a cross-sectional view of a structure 400, having a memory array region and a periphery, after processing structure 300 of FIG. 3. A metal barrier 414 has been formed on poly silicon region 312 in both the memory array region and in the periphery. Metal barrier 414 can be formed by a suitable process such as by a deposition process including but not limited to chemical vapor deposition (CVD), atomic layer deposition (ALD), or other deposition process. Other processes can be used. Metal barrier 414 can include multiple metals such as, but not limited to, WN and Ti. Metal barrier 414 can be formed as a Ti barrier metal on polysilicon region 312 with a WN barrier metal on the Ti barrier. Ti barrier metal can be formed as a Ti layer and WN barrier metal can be formed as a WN layer. Metal barrier 414 can be formed having a thickness from about 4 nm to 10 nm, which is a height from polysilicon region 312. Metal barrier 414 can be formed with other thicknesses. Metal barrier 414 will only remain in the periphery at the completion of the process flow associated with FIGS. 3-14.

Figure 5:
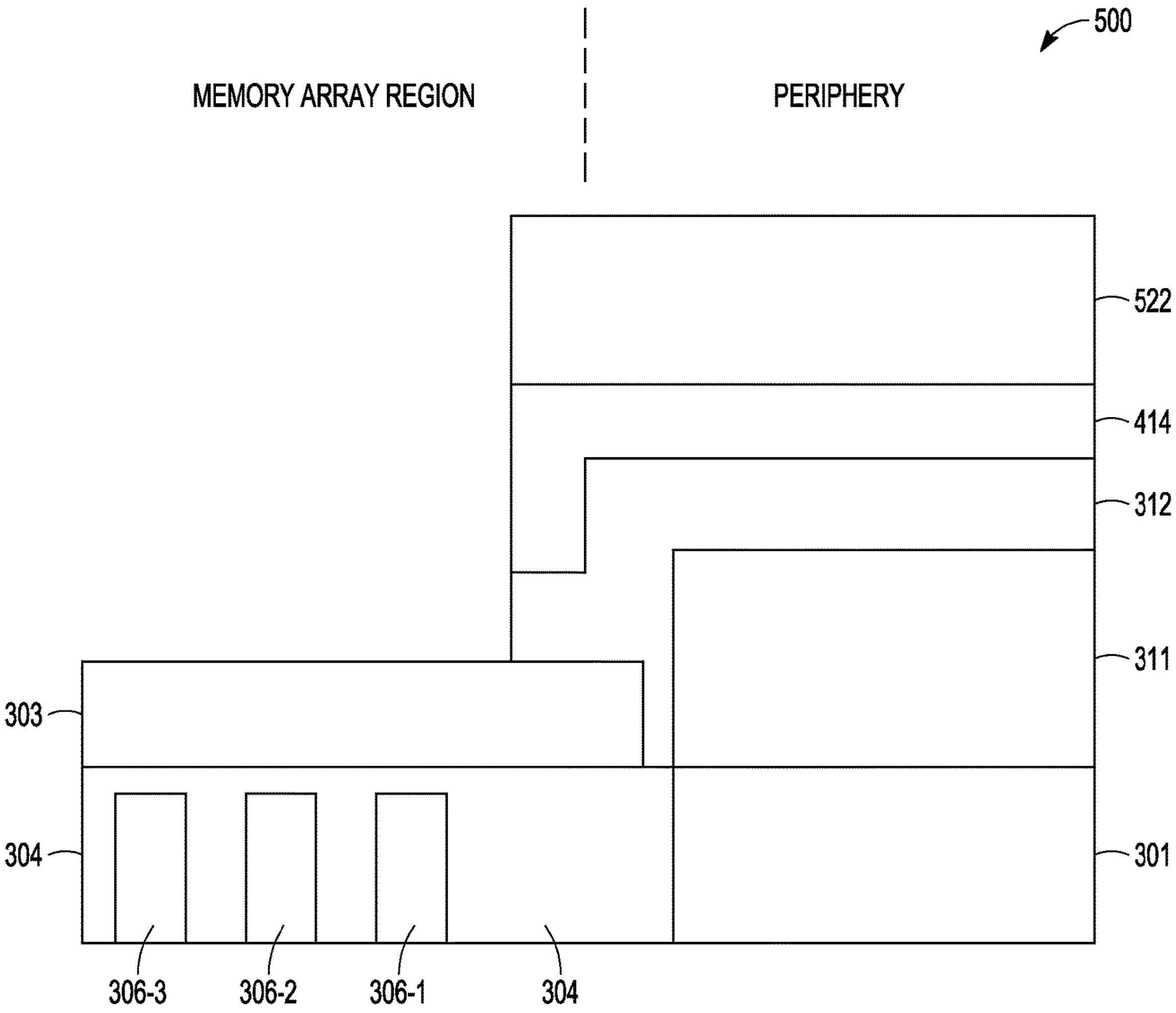

FIG. 5 illustrates a cross-sectional view of a structure 500, having a memory array region and a periphery, after processing structure 400 of FIG. 4. Patterning and etching has been applied to structure 400 to strip metal barrier 414 and polysilicon region 312 from the memory array region. The memory array region has been cleaned to clear polysilicon and barrier metals from the memory array region. A photoresist 522 remains on metal barrier 414 in the periphery, where photoresist 522 protected the periphery during the removal of metal barrier 414 and polysilicon region 312.

Figure 6:
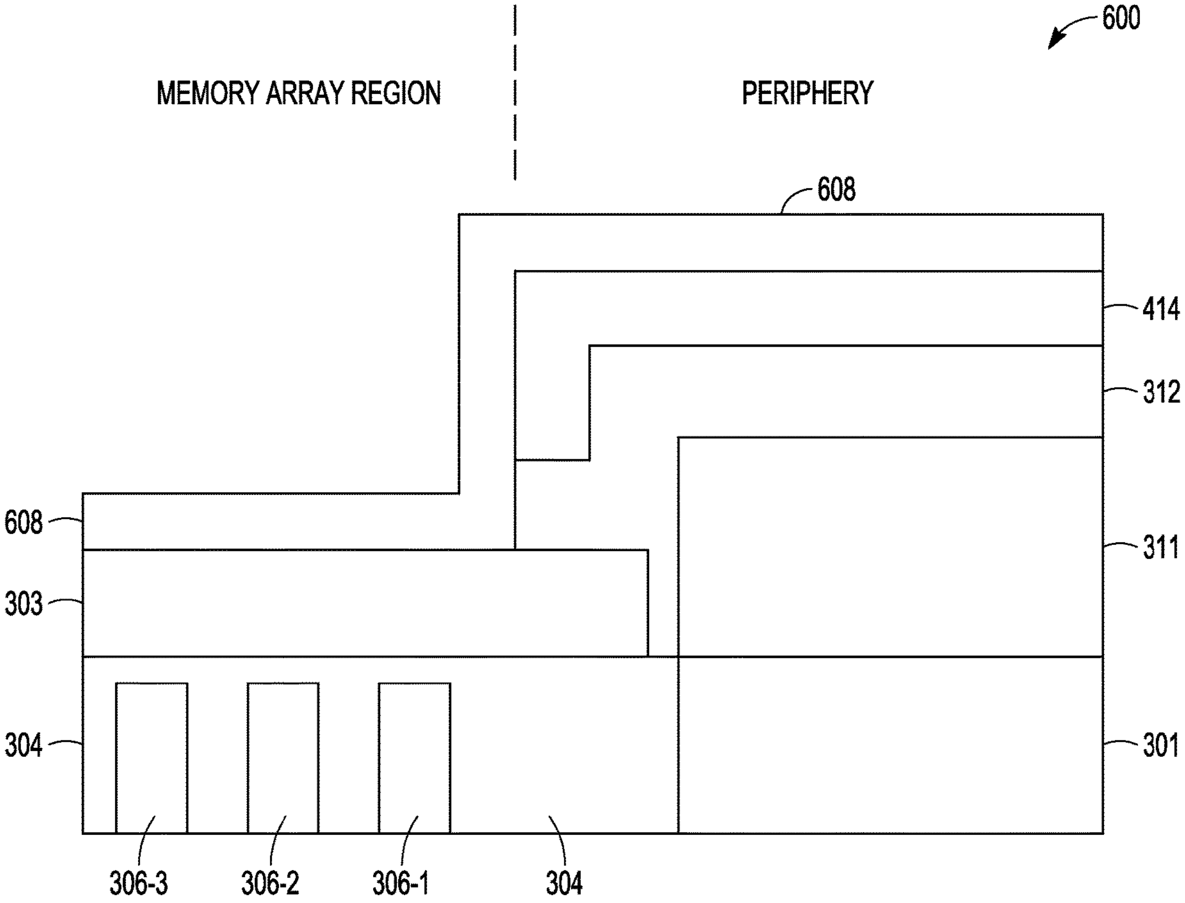

FIG. 6 illustrates a cross-sectional view of a structure 600, having a memory array region and a periphery, after processing structure 500 of FIG. 5. An ILD 608 has been formed after removing photoresist 522. ILD 608 can be a silicon oxide region, a silicon nitride region, or other suitable dielectric. ILD 608 can be formed using an appropriate deposition technique suitable for the dielectric formed for ILD 608. ILD 608 can be formed having a thickness from about 10 nm to 20 nm. ILD 608 can be formed having other thicknesses. ILD 608 provides an ILD protection for further processing.

Figure 7:
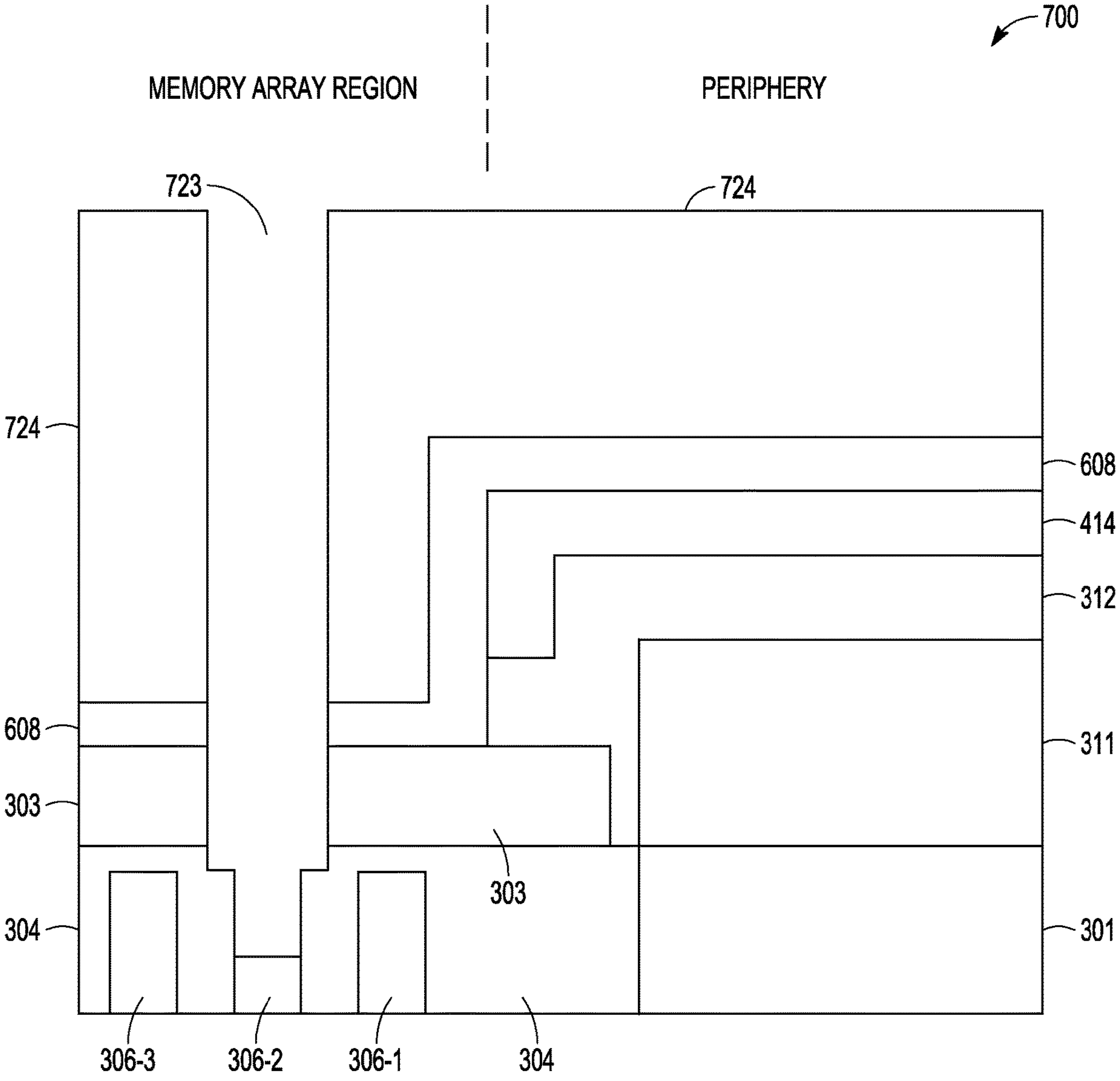

FIG. 7 illustrates a cross-sectional view of a structure 700, having a memory array region and a periphery, after processing structure 600 of FIG. 6. Photoresist or carbon patterning 724 has been applied to structure 600. The pattern corresponds to an array of digit line contacts for the memory array. Selected regions in photoresist or carbon patterning 724 have been etched, striping portions of ILD 608, ILD 303, and silicon region 306-2, resulting in an opening 723 in photoresist or carbon patterning 724. Though not shown, the pattern corresponding to the array of digit line contacts includes a number of other silicon regions partially etched with an opening in photoresist or carbon patterning 724 above the silicon regions. The surfaces of opening 723 have been cleaned for further processing.

Figure 8:
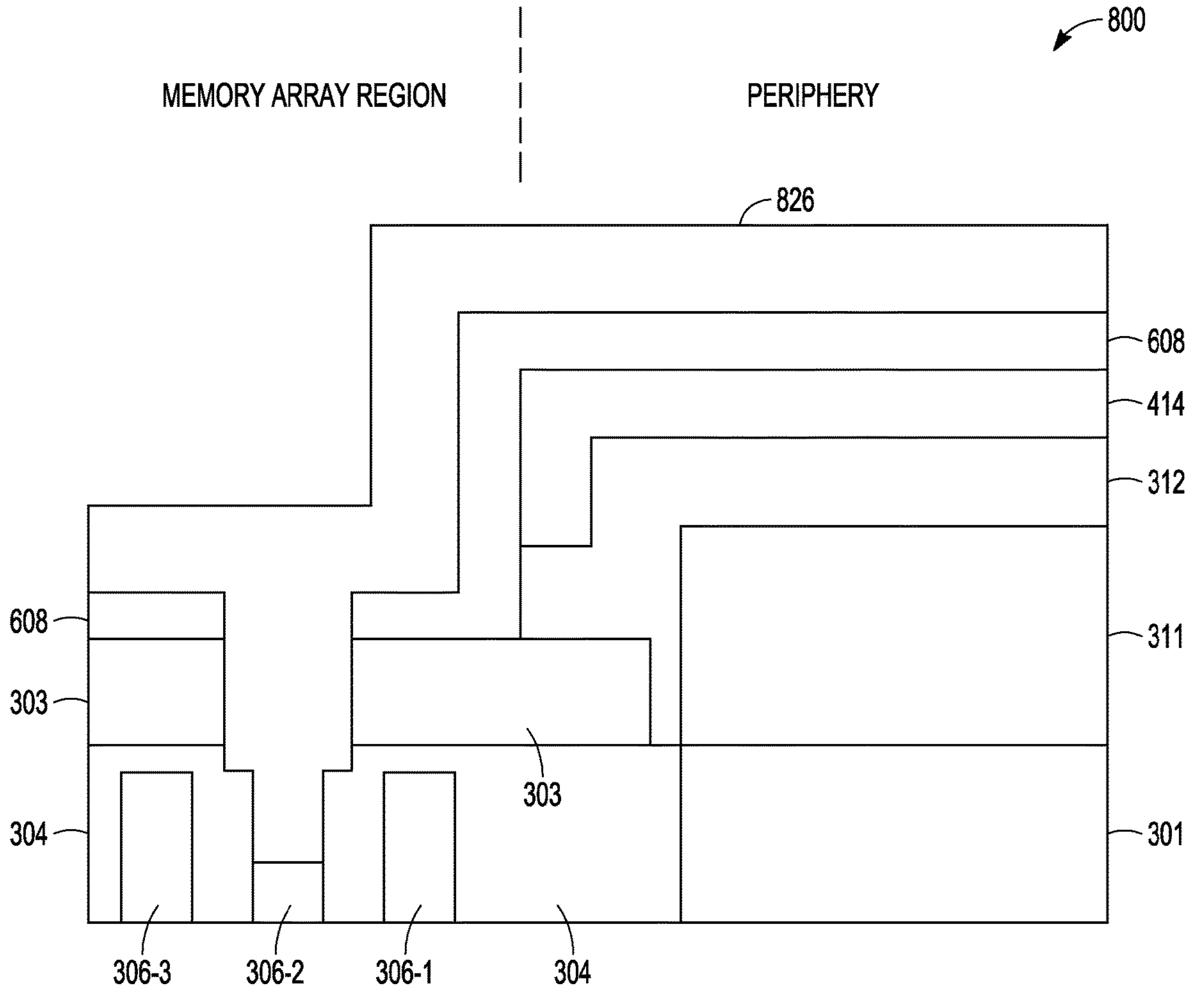

FIG. 8 illustrates a cross-sectional view of a structure 800, having a memory array region and a periphery, after processing structure 700 of FIG. 7. Photoresist or carbon patterning 724 has been removed and polysilicon 826 has been formed on the surface of ILD 608 in the memory array region and in the periphery of structure 700 and in opening 723 above silicon region 306-2. Polysilicon 826 can be formed using an appropriate deposition technique suitable for depositing polysilicon 826 on the surfaces of ILD 608 and surfaces of ILD 303 and ILD 304 forming portions of the surface of opening 723. Portions of polysilicon 826 will only remain in data line contacts in the memory array region at the completion of the process flow associated with FIGS. 3-14.

Figure 9:
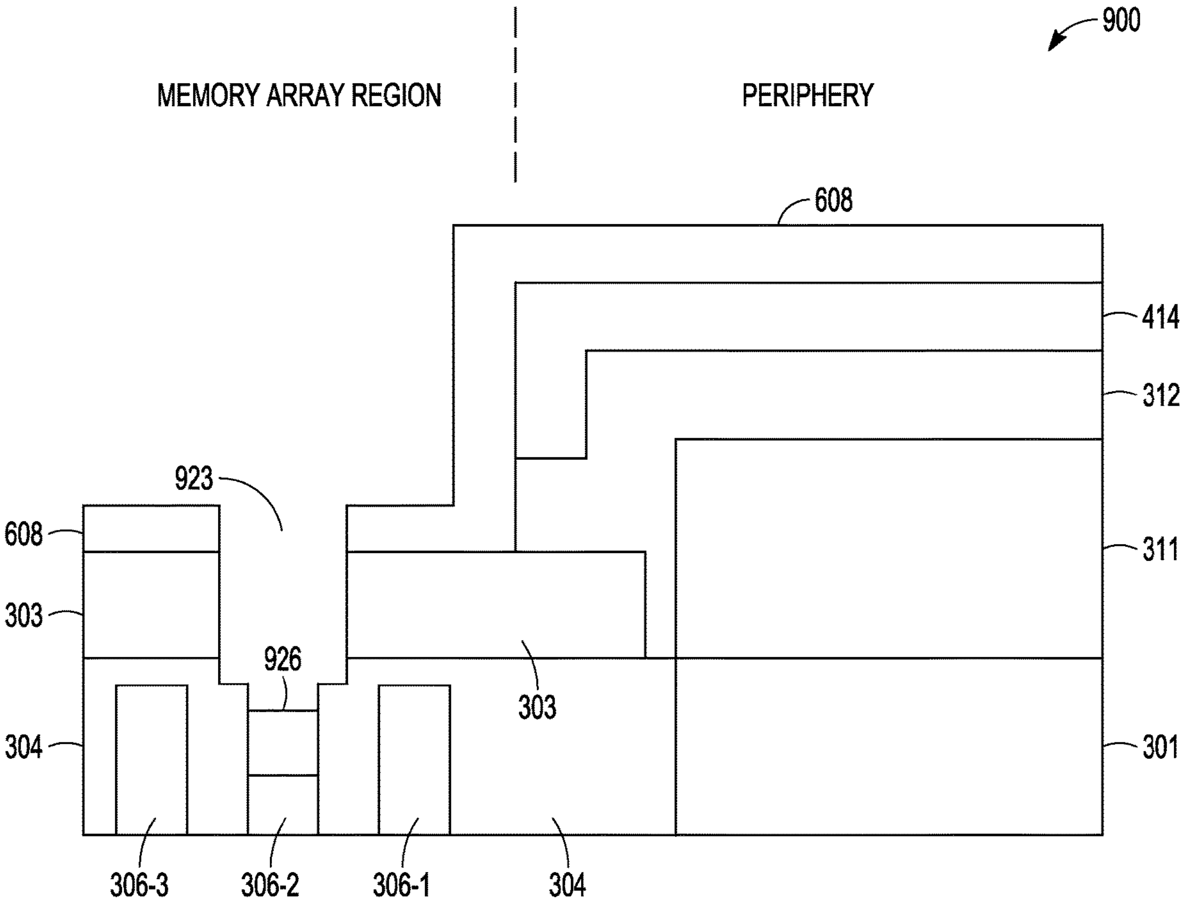

FIG. 9 illustrates a cross-sectional view of a structure 900, having a memory array region and a periphery, after processing structure 800 of FIG. 8. Polysilicon 826 has been etched back in structure 800, leaving a polysilicon plug 926 on silicon region 306-2. Polysilicon plug 926 can be a recessed region, where a target recess distance can be, but is not limited to, 5 nm. In an alternative process flow, polysilicon plug 926 can be doped epitaxial silicon (epi Si) that can be deposited in the process flow of FIG. 8, where the deposition is directed to forming the polysilicon plug 926 as doped epi Si by filing to the effective recess height from the bottom of opening 723 of FIG. 7. Top surfaces of ILD 608 and surfaces of ILDs 608, 303, and 304 of formed opening 923 are exposed for further processing.

Figure 10:
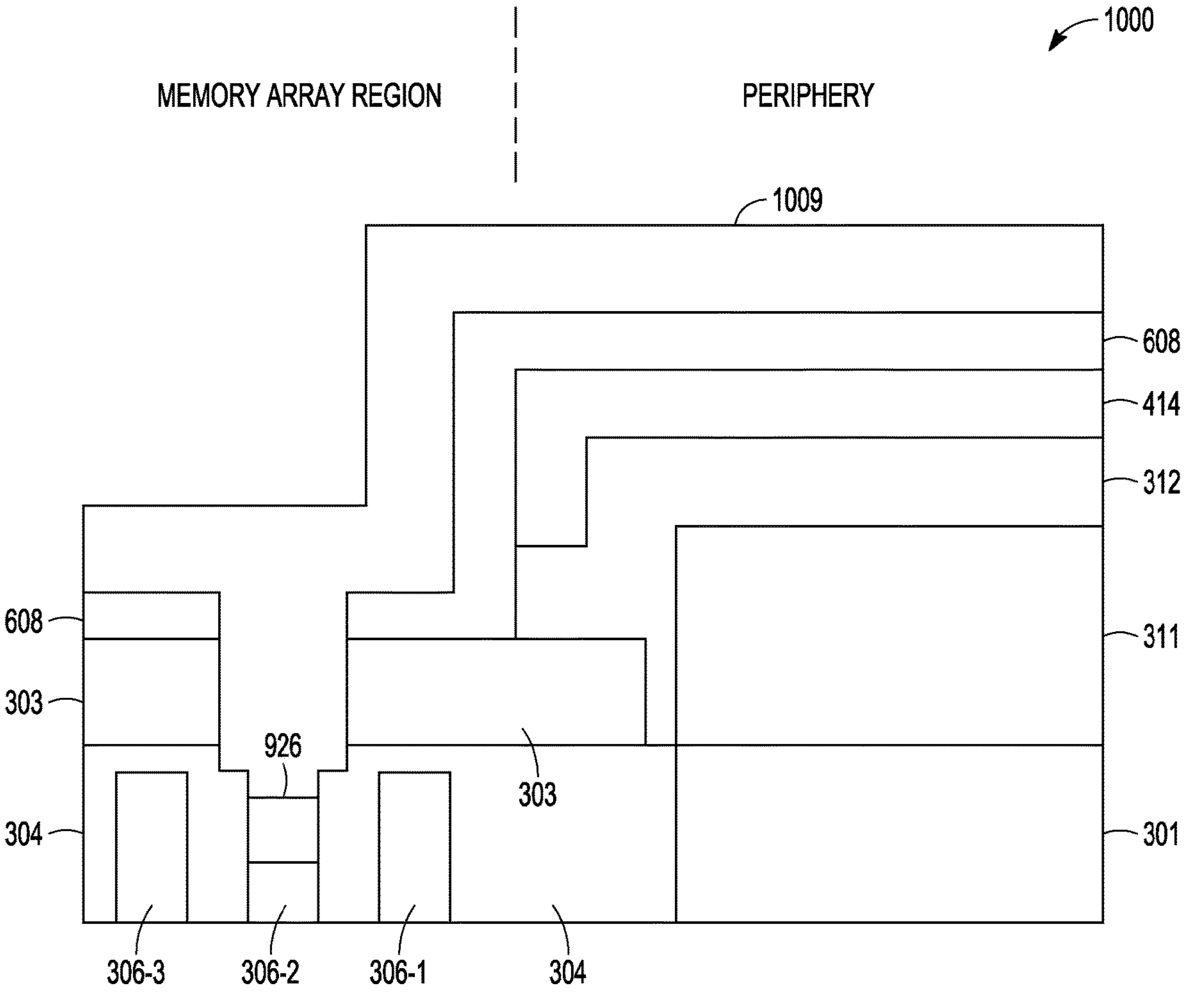

FIG. 10 illustrates a cross-sectional view of a structure 1000, having a memory array region and a periphery, after processing structure 900 of FIG. 9. A metal barrier 1009 has been formed on the surfaces of structure 900 including on the top surface of ILD 608, surfaces of ILDs 608, 303, and 304, defining opening 923, and on surface of polysilicon plug 926. Opening 923 has been filled with metal barrier 2209. Portions of the metal barrier 1009 are to be used as barrier metals in the memory array. Metal barrier 1009 can be formed by a suitable process such as by a deposition process including but not limited to CVD, ALD, or other deposition process. Other processes can be used. Metal barrier 1009 can include multiple metals such as, but not limited to, WN and Ti along with TiN or W. Metal barrier 1009 can be formed as a Ti barrier metal on the surfaces of structure 900 with a WN barrier metal on the Ti barrier and with TiN barrier metal or W barrier metal on the WN barrier metal. Ti, WN, TiN, and W barrier metals can each be formed as barrier metal layers. Portions of metal barrier 1009 will only remain in the memory array region at the completion of the process flow associated with FIGS. 3-14.

Figure 11:
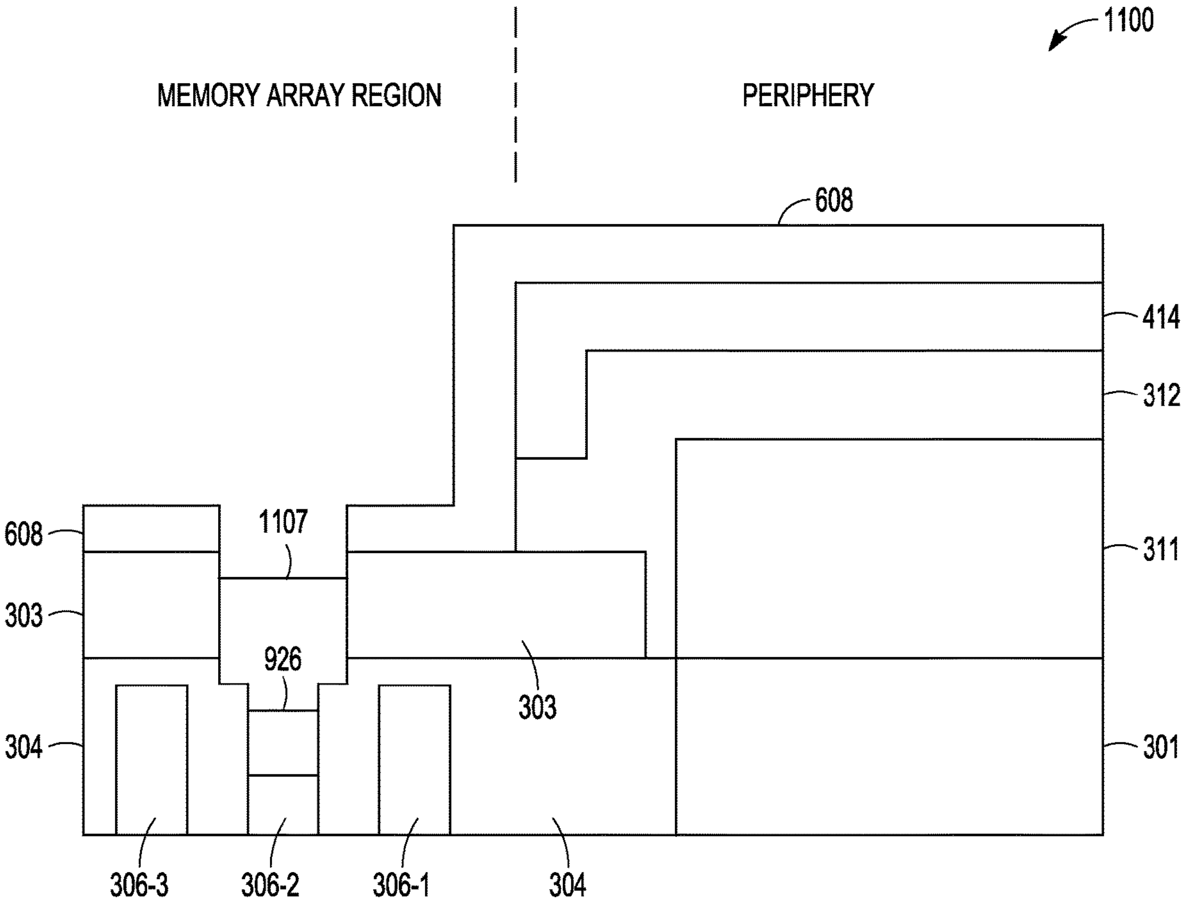

FIG. 11 illustrates a cross-sectional view of a structure 1100, having a memory array region and a periphery, after processing structure 1000 of FIG. 10. Metal barrier 1009 has been etched back leaving a digit line contact 1107 on and contacting polysilicon plug 926 on silicon region 306-2.

Figure 12:
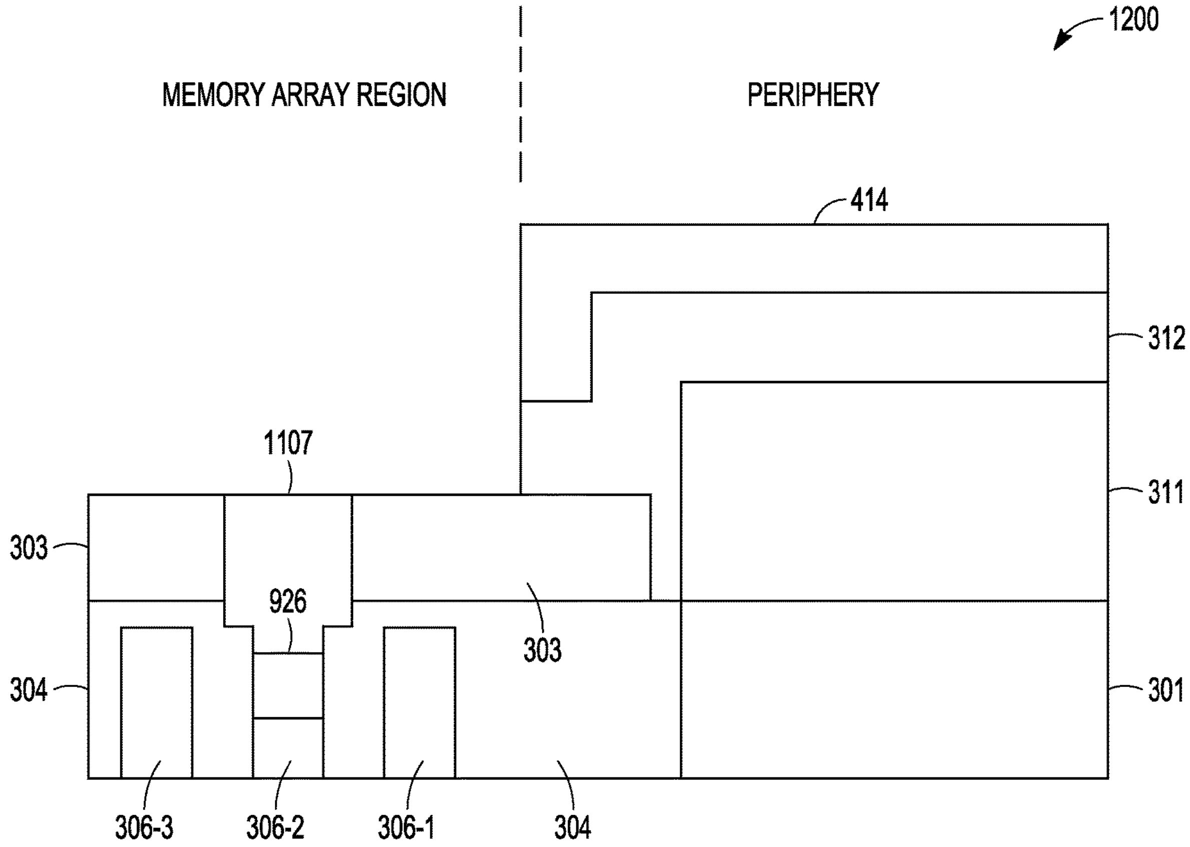

FIG. 12 illustrates a cross-sectional view of a structure 1200, having a memory array region and a periphery, after processing structure 1100 of FIG. 11. ILD 608 has been removed in the memory array region and in the periphery. The surface of ILD 303 and the surface of digit line contact 1107 are exposed in memory array region and the surface of metal barrier 414 is exposed in the periphery.

Figure 13:
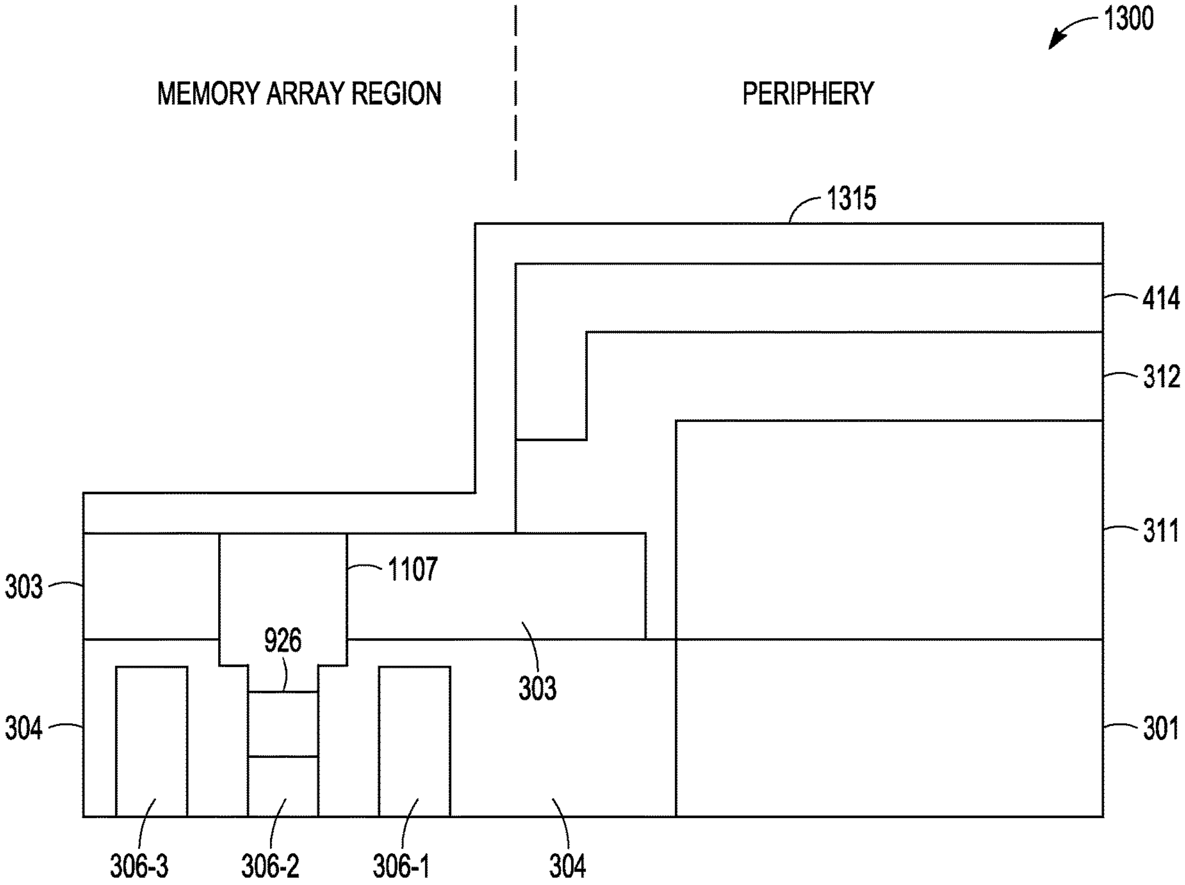

FIG. 13 illustrates a cross-sectional view of a structure 1300, having a memory array region and a periphery, after processing structure 1200 of FIG. 12. A barrier metal 1315 is formed on the surface of structure 1200 of FIG. 12 in both the memory array region and in the periphery, including on the top surface of digit line contact 1107 that is on and contacting polysilicon plug 926 on silicon region 306-2. Barrier metal 1315 can be formed by a suitable process such as by a deposition process including but not limited to CVD, ALD, or other deposition process. Other processes can be used. Barrier metal 1315 can be formed as $WSi_X$. Barrier metal 1315 can be formed having a thickness of about 2.5 nm. Barrier metal 1315 can be formed with other thicknesses.

Figure 14:
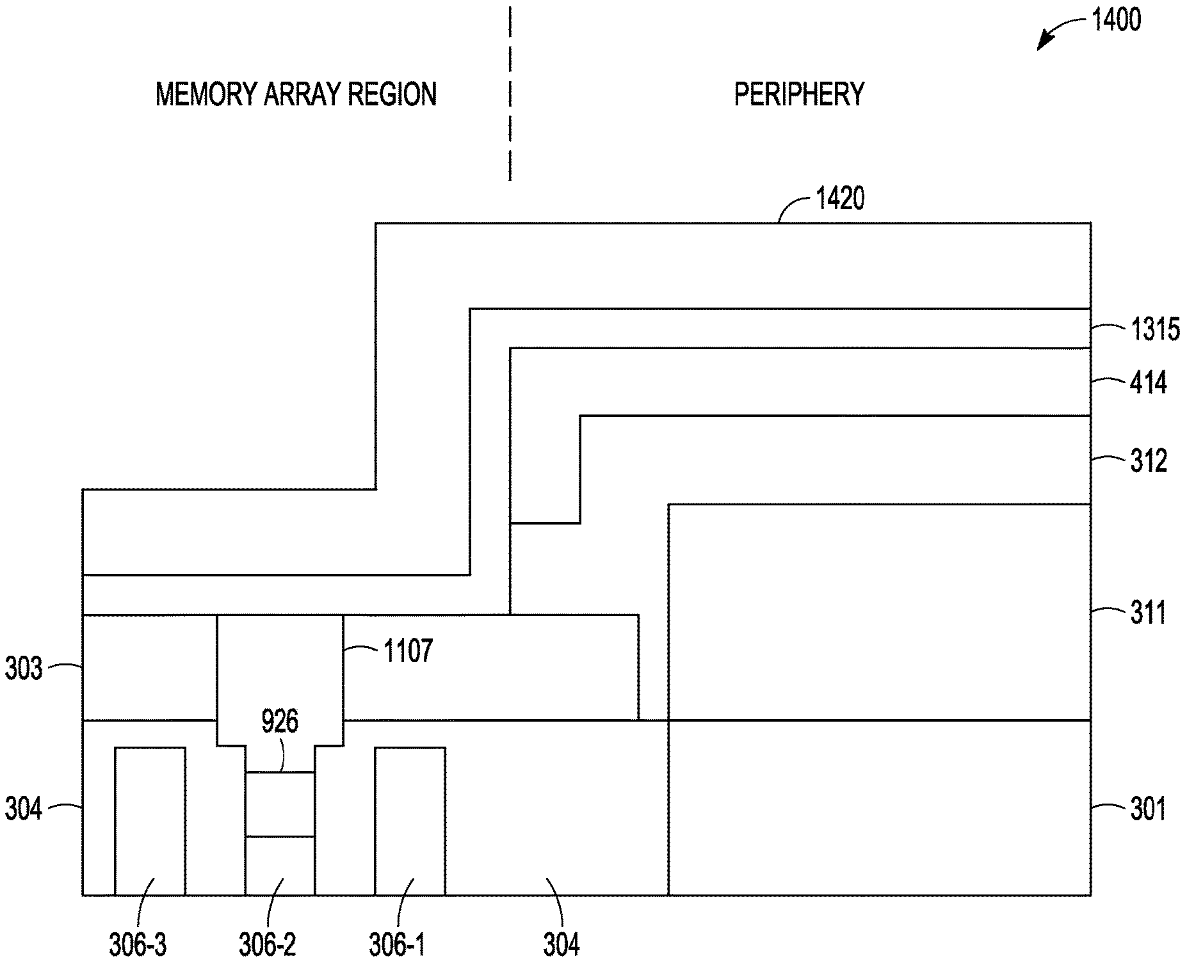

FIG. 14 illustrates a cross-sectional view of a structure 1400, having a memory array region and a periphery, after processing structure 1300 of FIG. 13. A metal 1420 has been formed on the surface of barrier metal 1315 in both the memory array region and in the periphery. Metal 1420 can be formed by a suitable process such as by a deposition process including but not limited to CVD, ALD, or other deposition process. Other processes can be used. Metal 1420 can be formed as W. Metal 1420 can be formed having a thickness of about 10 nm to about 30 nm. Metal 1420 can be formed with other thicknesses. In the periphery, metal 1420 is a metal contact to the transistor having gate 311, where barrier metal 1315, metal barrier 414, and polysilicon region 312 couple gate 311 to metal 1420. In the memory array region, metal 1420 is a digit line having barrier metal 1315 as a single barrier metal above ILD 303, where barrier metal 1315 couples the digit line to the digit line contact 1107 that is on and contacting polysilicon plug 926 on silicon region 306-2.

Structure 1400 can be further processed such that metal 1420 in the periphery is separated from metal 1420 in the memory array region. Structure 1400 with the separated metal 1420 has a single barrier metal for the digit line in the memory array region, which is a structure similar to architecture 100 of FIG. 1. Depending on the memory device design and conductive contact architecture for the memory device, metallic materials other than those discussed above can be used in similar approaches.

Various deposition techniques for components of structures 300-1400 in the process flow of FIGS. 3-14 can be used that are typical for the material being formed, the dimensions of the material being formed, and the architecture in which the material is being formed. Selective etching can be used to remove selected regions in the processing discussed with respect to FIGS. 3-14. Selective etching is a process in which one or more materials are removed from a structure, while one or more other materials remain in the structure with no or little removal. Selective etching can depend on the material to be etched, the material not to be etched, the etchant employed, and the method for etching. Types of etching include wet etching and dry etching, where each of these two basic methods include a number of different etching procedures. In addition, conventional masking techniques, providing protective regions in the processing, can be used in removal of selected regions in forming single metal barriers connecting digit lines to digit line contacts in the memory array, with the single metal barriers on the dielectric on which digit lines are routed in the memory array region of the memory device.

FIGS. 15-25 illustrate an embodiment of another example process flow for forming a metal conductive region to a memory array region of a memory device and to a periphery to the memory array region of a memory device, where barrier stacks are split between the memory array region and the periphery. The process flow provides a digit line directly connecting to a digit line contact without use of a barrier metal, with the digit line directly on the dielectric on which digit lines are routed in the memory array region of the memory device. The process flow also provides a metal contact to a transistor in the periphery with multiple metal barriers between the metal contact and a gate of the transistor.

Figure 15:
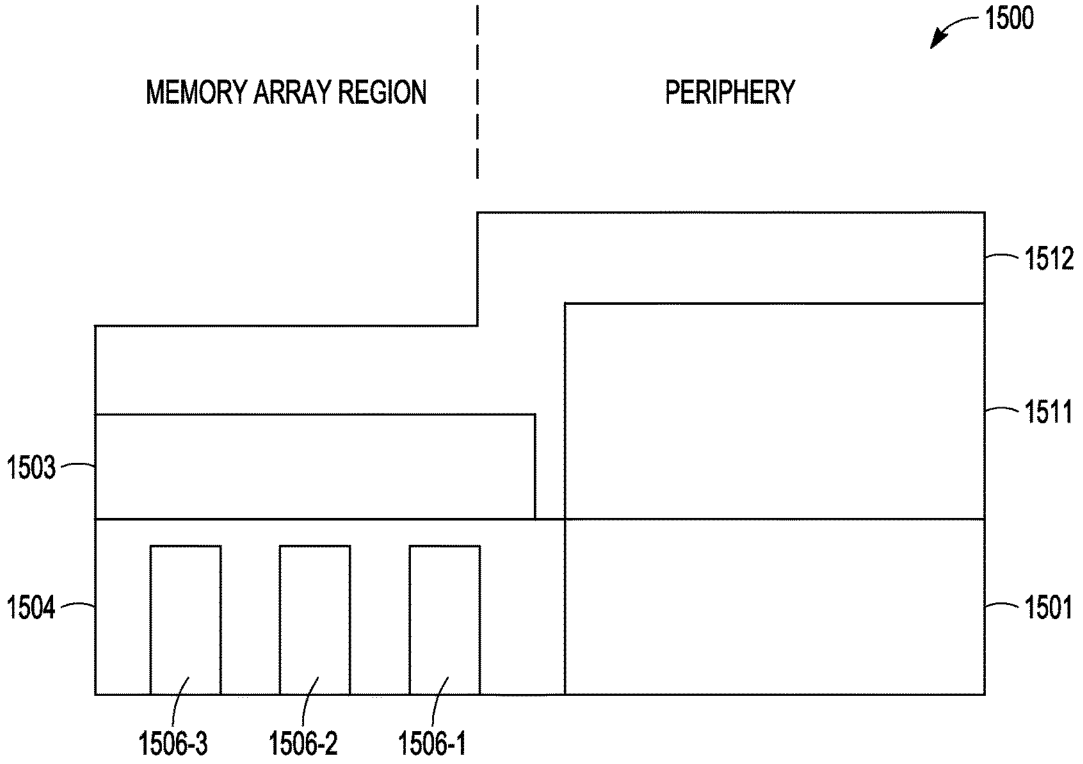
FIGS. 15-25 illustrate another example process flow for forming a metal conductive region to a memory array region of a memory device and to a periphery to the memory array region of a memory device, where barrier stacks are split between the memory array region and the periphery, according to various embodiments.

FIG. 15 illustrates a cross-sectional view of a structure 1500 of a memory device having a memory array region and a periphery. Memory array region includes a polysilicon region 1512 on an ILD 1503 placed on another ILD 1504, in which silicon regions 1506-3, 1506-2, and 1506-1 are located. Though three silicon regions are shown, more or less than three silicon regions can be formed. For a memory array, such silicon regions can be significantly more in number than three. ILD 1503 can include silicon oxide, such as $SiO_2$, silicon nitride, such as $Si_3N_4$, or other appropriate dielectric material. Poly silicon region 1512 has also been formed in the periphery on a gate 1511. Gate 1511 can be a HKMG on a substrate region 1501, which can be a silicon substrate region. Example heights for components of structure 1500 can include, but are not limited to, polysilicon 1510 having a height of 5-15 nm, ILD 1503 having a height of 5-20 nm, and gate 1511 having a height of 15-25 nm. Polysilicon region 1512 will only remain in the periphery at the completion of the process flow associated with FIGS. 15-25. Structure 1500 provides a starting structure for this process flow.

Figure 16:
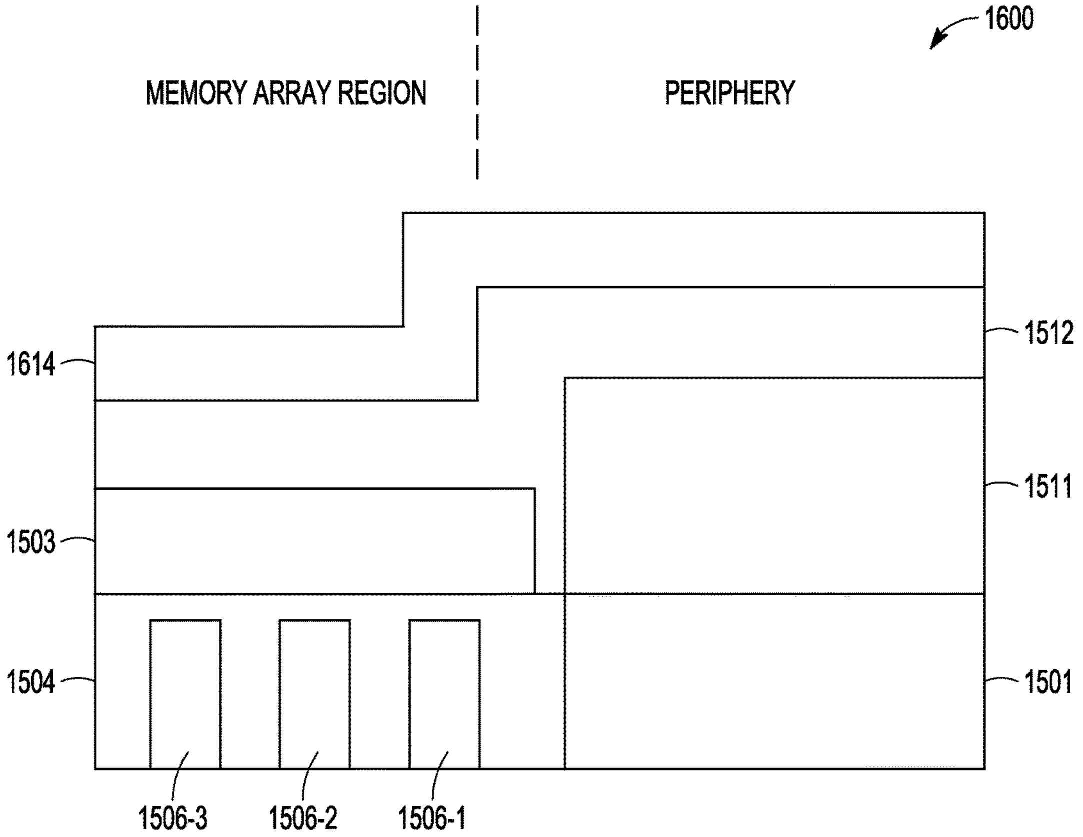

FIG. 16 illustrates a cross-sectional view of a structure 1600, having a memory array region and a periphery, after processing structure 1500 of FIG. 15. A metal barrier 1614 has been formed on polysilicon region 1512 in both the memory array region and in the periphery. Metal barrier 1614 can be formed by a suitable process such as by a deposition process including but not limited to CVD, ALD, or other deposition process. Other processes can be used. Metal barrier 1614 can include multiple barrier metals. Selection of the barrier metals of metal barrier 1614 can depend on the metal to be used in the digit lines in the memory array region.

For W digit lines and metal contacts in the periphery, metal barrier 1614 can include barrier metals such as, but not limited to, $WSi_X$, WN, and Ti. Metal barrier 1614 can be formed as a Ti barrier metal on polysilicon region 1512 with a WN barrier metal on the Ti barrier and a $WSi_X$ barrier metal on the WN barrier metal. Ti barrier metal can be formed as a Ti layer, WN barrier metal can be formed as a WN layer, and $WSi_X$ barrier metal can be formed as a $WSi_X$ layer. Metal barrier 1614 can be formed having a thickness from about 6 nm to 15 nm, which is a height from polysilicon region 1512. Metal barrier 1614 can be formed with other thicknesses.

For ruthenium (Ru) digit lines and metal contacts in the periphery, metal barrier 1614 can include barrier metals such as, but not limited to, TiN and Ti. Metal barrier 1614 can be formed as a Ti barrier metal on polysilicon region 1512 with a TiN barrier metal on the Ti barrier. Ti barrier metal can be formed as a Ti layer, and TiN barrier metal can be formed as a TiN layer. Metal barrier 1614 can be formed having a thickness from about 6 nm to 12 nm, which is a height from polysilicon region 1512. Metal barrier 1614 can be formed with other thicknesses. For both W and Ru digit lines, metal barrier 1614 will only remain in the periphery at the completion of the process flow associated with FIGS. 3-14.

Figure 17:
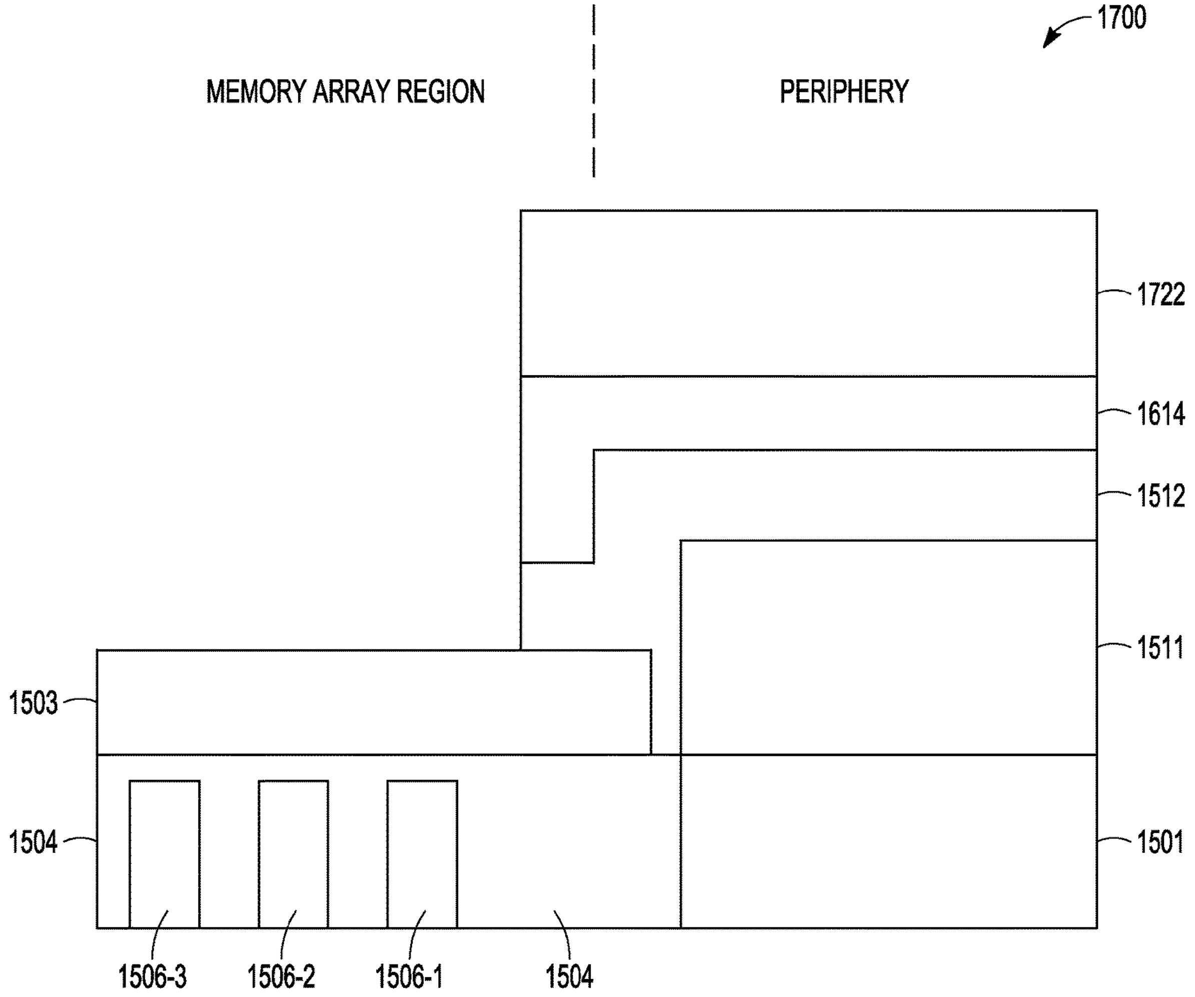

FIG. 17 illustrates a cross-sectional view of a structure 1700, having a memory array region and a periphery, after processing structure 1600 of FIG. 16. Patterning and etching has been applied to structure 1600 to strip metal barrier 1614 and poly silicon region 1512 from the memory array region. The memory array region has been cleaned to clear polysilicon and barrier metals from the memory array region. A photoresist 1722 remains on metal barrier 1614 in the periphery, where photoresist 1722 protected the periphery during the removal of metal barrier 1614 and polysilicon region 1512 in the memory array region.

Figure 18:
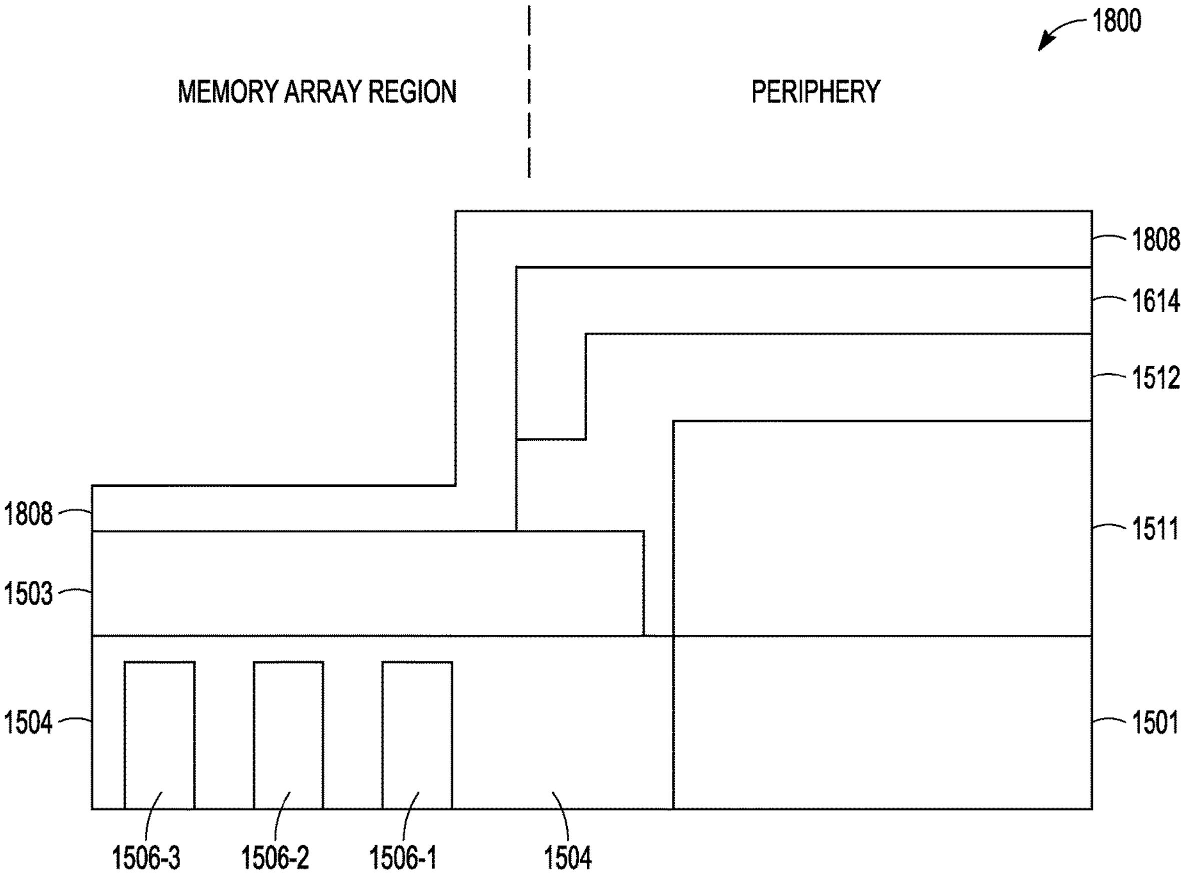

FIG. 18 illustrates a cross-sectional view of a structure 1800, having a memory array region and a periphery, after processing structure 1700 of FIG. 17. An ILD 1808 has been formed after removing photoresist 1722 from structure 1700. ILD 1808 can be a silicon oxide region, a silicon nitride region, or other suitable dielectric. ILD 1808 can be formed using an appropriate deposition technique suitable for the dielectric material formed for ILD 1808. ILD 1808 can be formed having a thickness from about 10 nm to 20 nm. ILD 1808 can be formed having other thicknesses. ILD 1808 provides an ILD protection for further processing.

Figure 19:
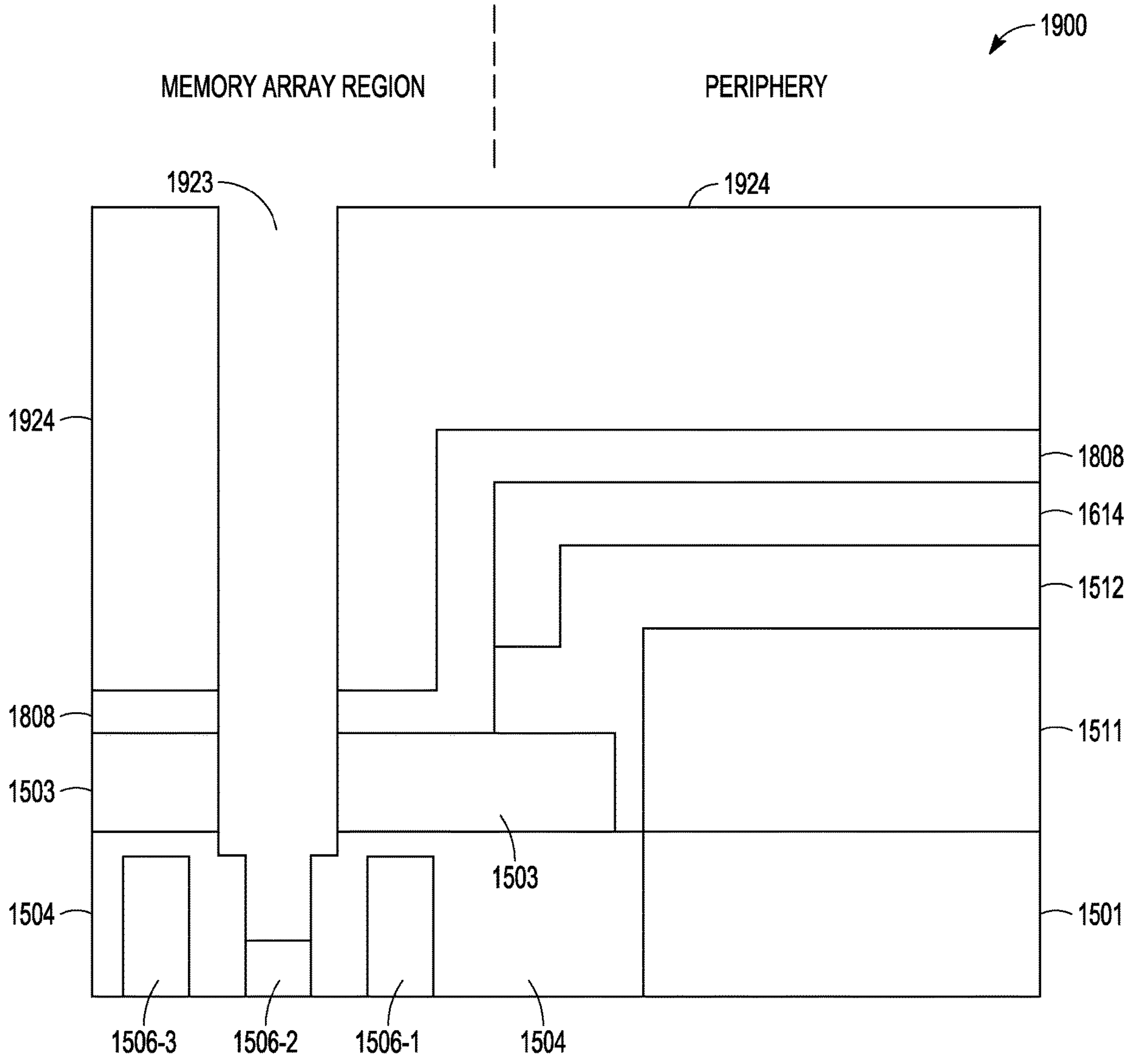

FIG. 19 illustrates a cross-sectional view of a structure 1900, having a memory array region and a periphery, after processing structure 1800 of FIG. 18. Photoresist or carbon patterning 1924 has been applied to structure 1800. The pattern corresponds to an array of digit line contacts for the memory array. Selected regions in photoresist or carbon patterning 1924 have been etched, striping portions of ILD 1808, ILD 1503, and silicon region 1506-2, resulting in an opening 1923 in photoresist or carbon patterning 1924. Though not shown, the pattern corresponding to the array of digit line contacts includes a number of other silicon regions partially etched with an opening in photoresist or carbon patterning 1924 above the silicon regions. The surfaces of opening 1923 have been cleaned for further processing.

Figure 20:
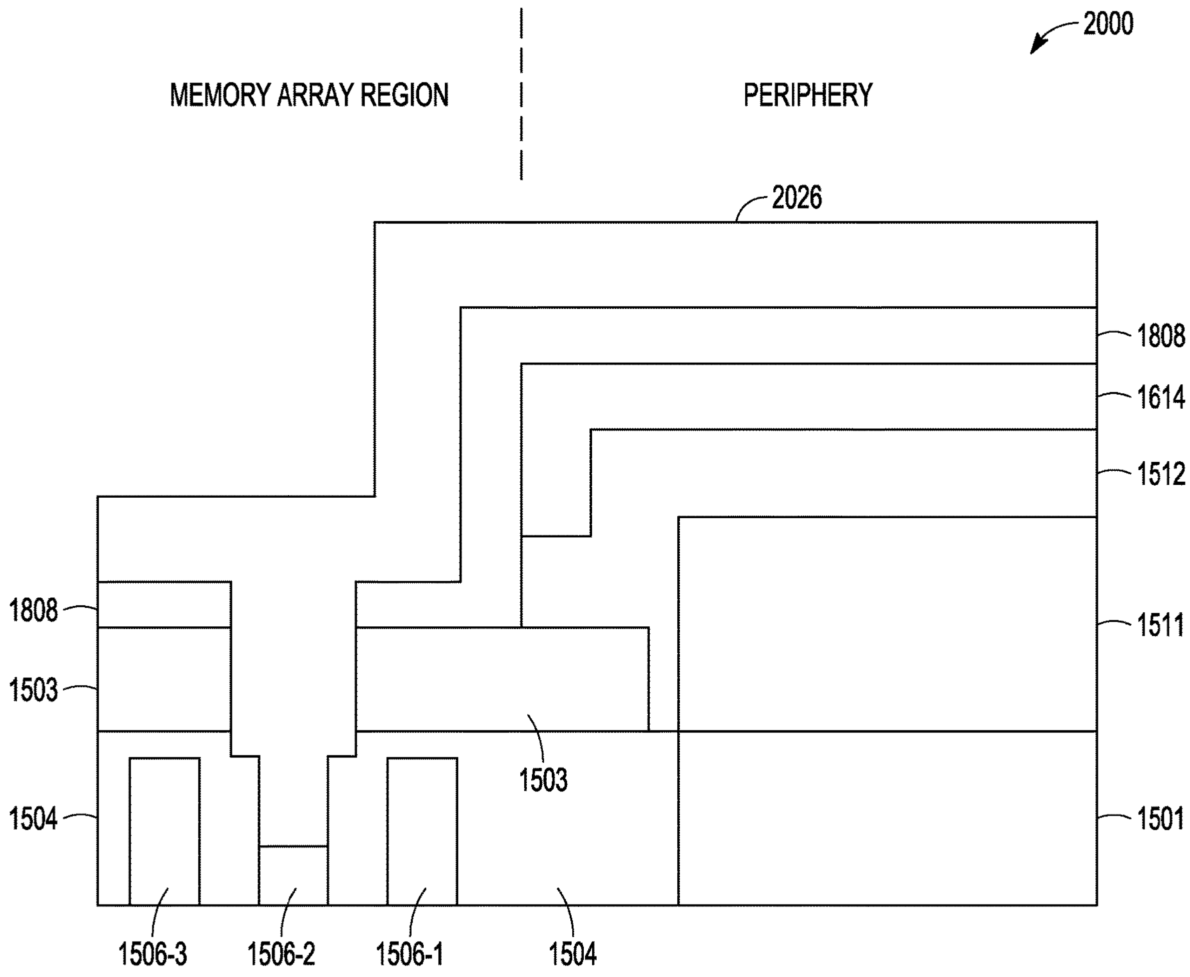

FIG. 20 illustrates a cross-sectional view of a structure 2000, having a memory array region and a periphery, after processing structure 1900 of FIG. 19. Photoresist or carbon patterning 1924 has been removed and polysilicon 2026 has been formed on the surface of structure 1900 and in opening 1923 above silicon region 1506-2. Polysilicon 2026 can be formed using an appropriate deposition technique suitable for depositing polysilicon 2026 on the surfaces of ILD 1808 and surfaces of ILD 1503 and ILD 1504 forming portions of the surface of opening 1923. Portions of polysilicon 2026 will only remain in a data line contact in the memory array region at the completion of the process flow associated with FIGS. 15-25.

Figure 21:
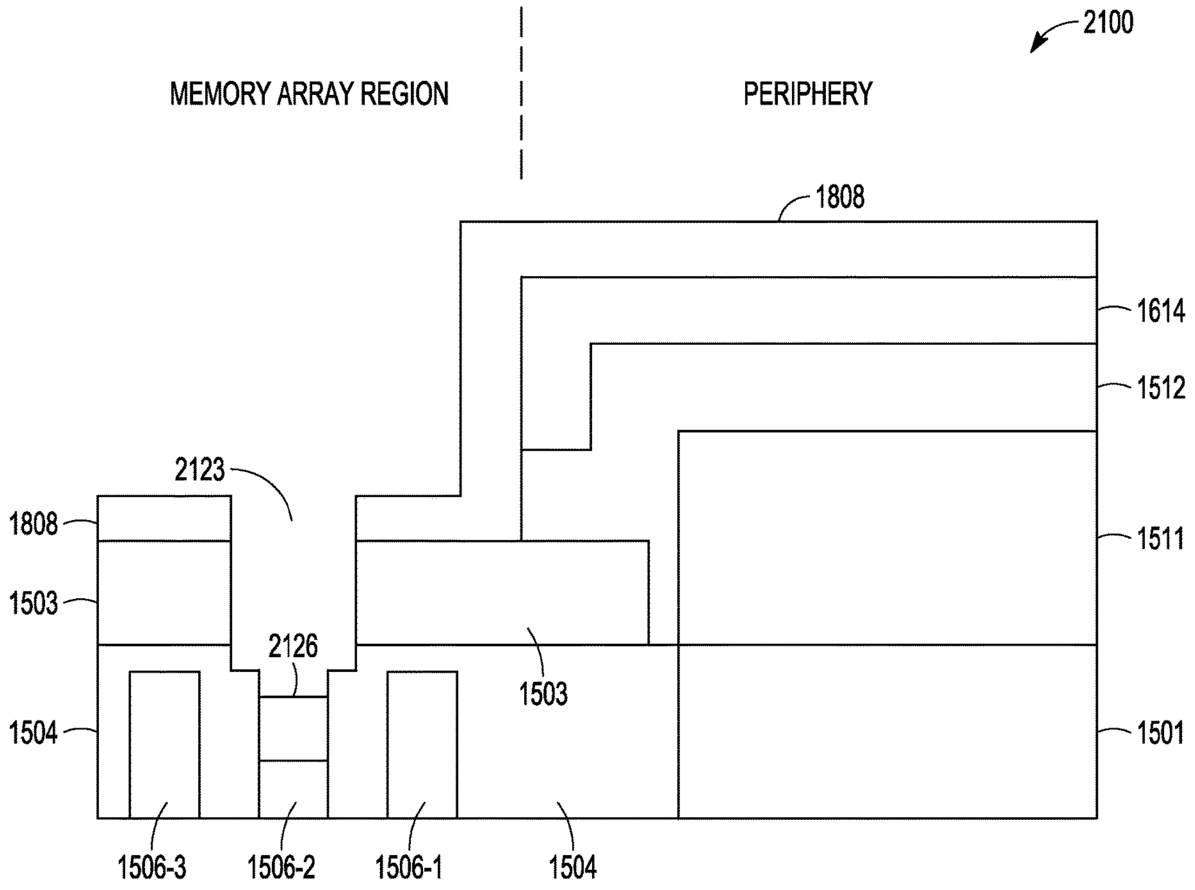

FIG. 21 illustrates a cross-sectional view of a structure 2000, having a memory array region and a periphery, after processing structure 2000 of FIG. 20. Polysilicon 2026 has been etched back in structure 2000, leaving a polysilicon plug 2126 on silicon region 1506-2. Polysilicon plug 2126 can be a recessed region, where a target recess distance can be, but is not limited to, 5 nm. In an alternative process flow, polysilicon plug 2126 can be doped epi Si that can be deposited in the process flow of FIG. 20, where the deposition is directed to forming the polysilicon plug 2126 as doped epi Si by filing to the effective recess height from the bottom of opening 1923 of FIG. 19. Top surfaces of ILD 1808 and surfaces of ILDs 1808, 1503, and 1504 of formed opening 1923 are exposed for further processing.

Figure 22:
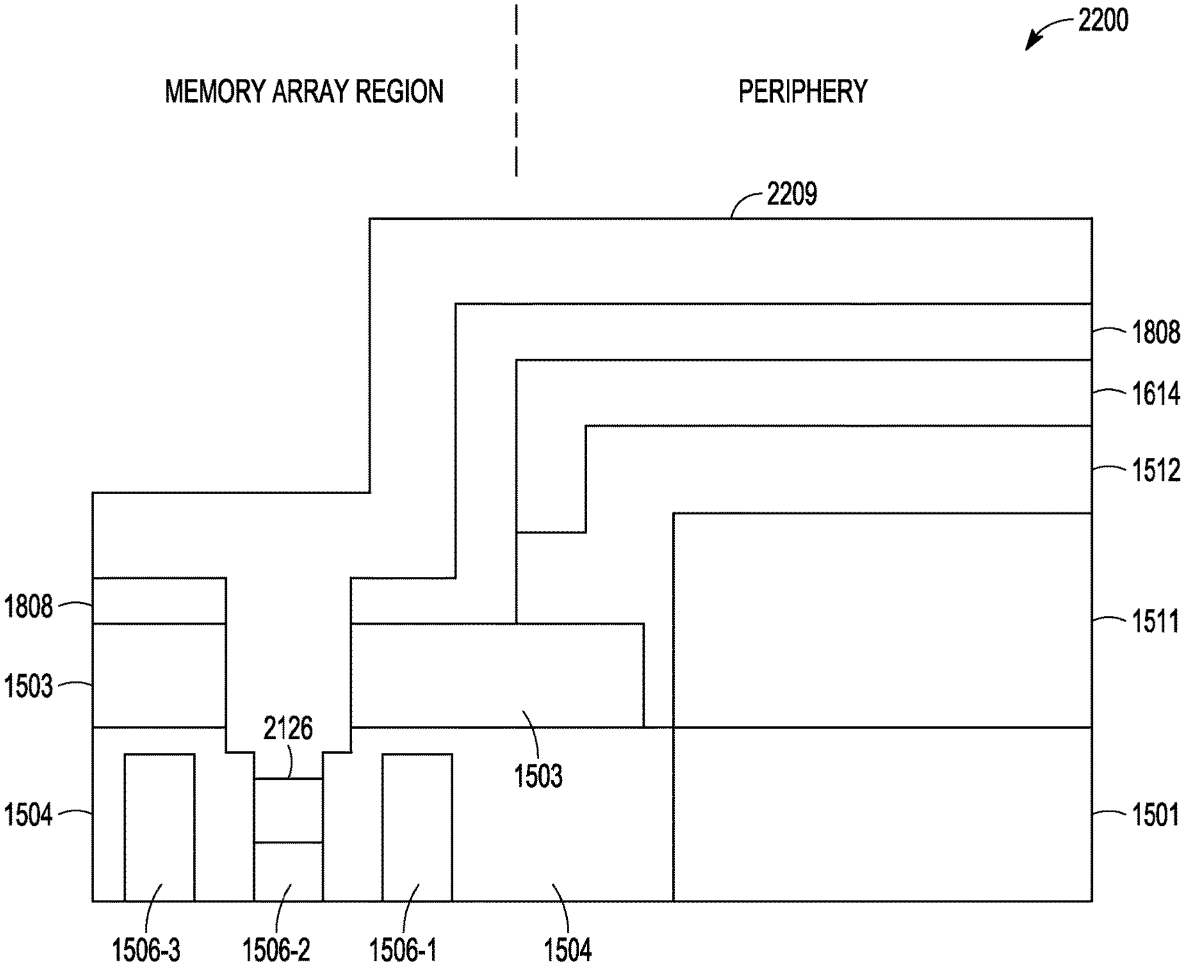

FIG. 22 illustrates a cross-sectional view of a structure 2200, having a memory array region and a periphery, after processing structure 2100 of FIG. 21. A metal barrier 2209 has been formed on the surfaces of structure 2100 including on the top surface of ILD 1808, surfaces of ILDs 1808, 1503, and 1504 defining opening 1923, and on a top surface of polysilicon plug 2126. Opening 1923 has been filled with metal barrier 2209. Portions of the metal barrier 2209 are to be used as barrier metals in the memory array. Metal barrier 2209 can be formed by a suitable process such as by a deposition process including but not limited to CVD, ALD, or other deposition process. Other processes can be used. Metal barrier 2209 can include multiple barrier metals. Selection of the barrier metals of metal barrier 2209 can depend on the metal to be used in the digit lines in the memory array region.

For W digit lines, metal barrier 2209 can include barrier metals such as, but not limited to, WN and Ti along with TiN or W. Metal barrier 2209 can be formed as a Ti barrier metal on the surfaces of structure 2100, including the top surface of polysilicon plug 2126, with a WN barrier metal on the Ti barrier and with TiN barrier metal or W barrier metal on the WN barrier metal. Ti, WN, TiN, and W barrier metals can each be formed as barrier metal layers.

For Ru digit lines, metal barrier 2209 can include barrier metals such as, but not limited to, TiN and Ti. Metal barrier 2209 can be formed as a Ti barrier metal on the surfaces of structure 2100, including the top surface of polysilicon plug 2126, with a TiN barrier metal on the Ti barrier. Ti barrier metal can be formed as a Ti layer and TiN barrier metal can be formed as a TiN layer. For both W and Ru digit lines, portions of metal barrier 2209 will only remain in the memory array region at the completion of the process flow associated with FIGS. 15-25.

Figure 23:
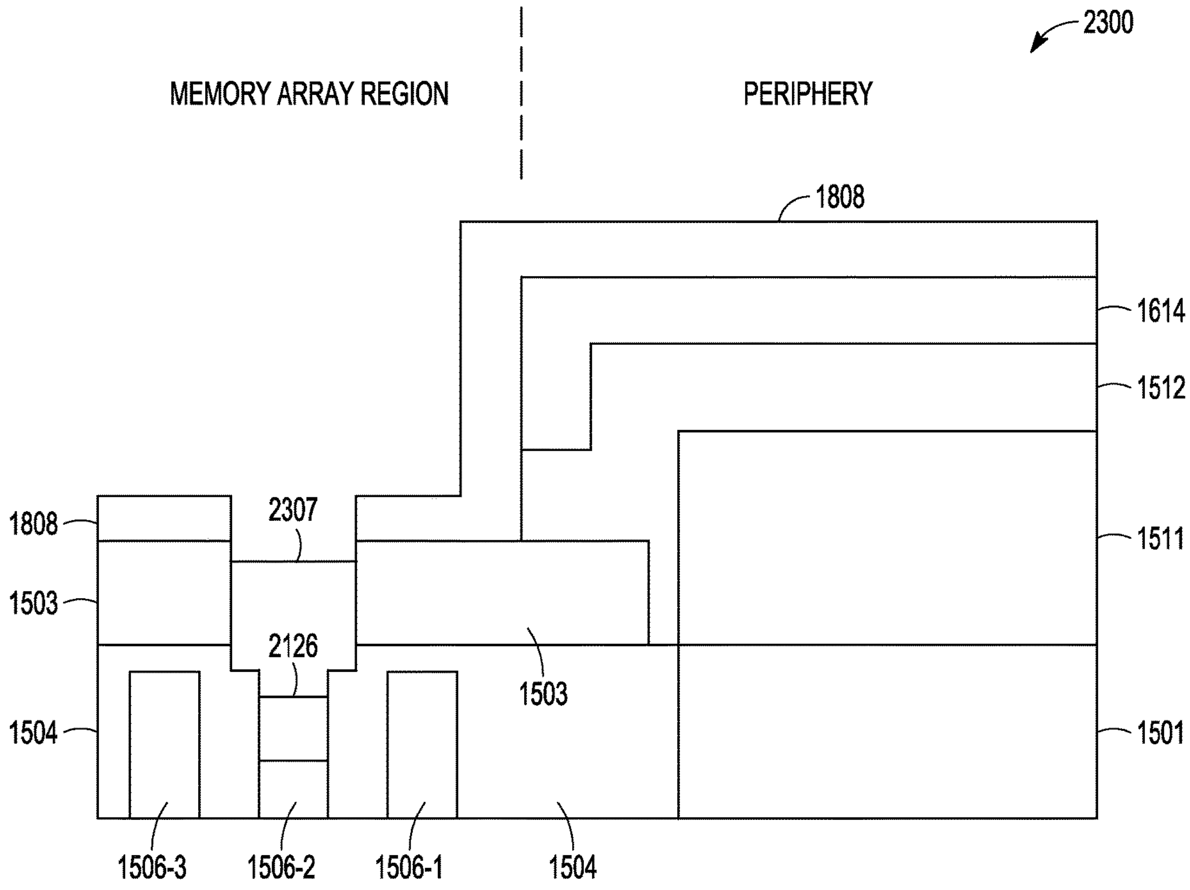

FIG. 23 illustrates a cross-sectional view of a structure 2300, having a memory array region and a periphery, after processing structure 2200 of FIG. 22. Metal barrier 2209 has been etched back leaving a digit line contact 2307 on and contacting polysilicon plug 2126 on silicon region 1506-2.

Figure 24:
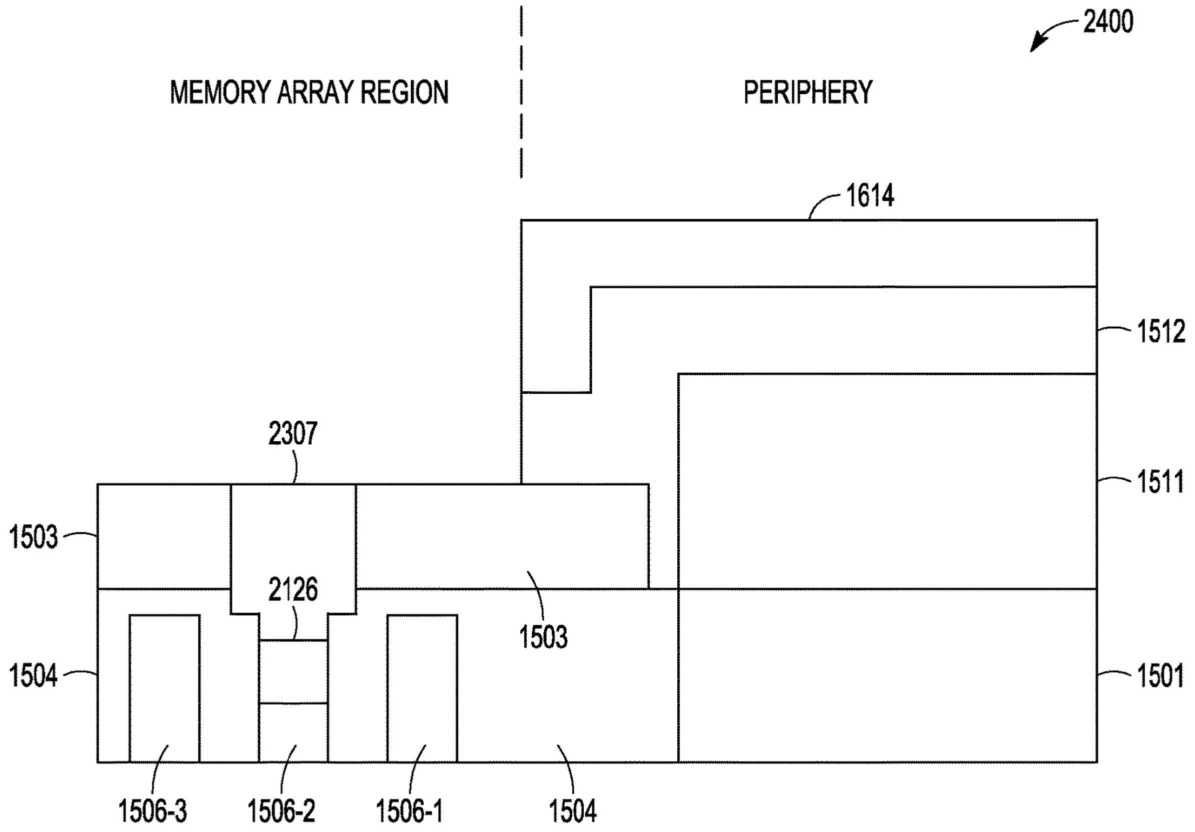

FIG. 24 illustrates a cross-sectional view of a structure 2300, having a memory array region and a periphery, after processing structure 2300 of FIG. 23. ILD 1808 has been removed in the memory array region and in the periphery. The surface of ILD 1503 and the surface of digit line contact 2307 are exposed in memory array region and the surface of metal barrier 1614 is exposed in the periphery.

Figure 25:
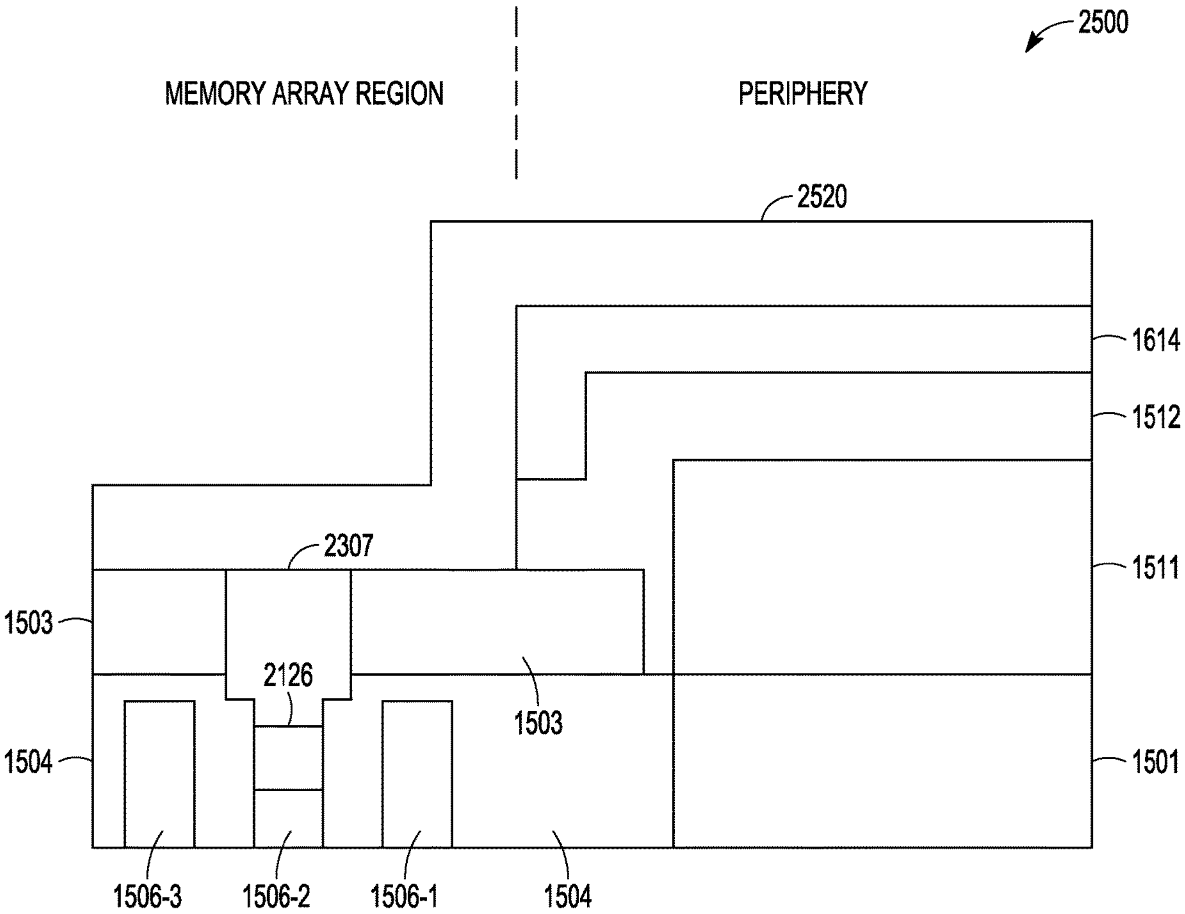

FIG. 25 illustrates a cross-sectional view of a structure 2500, having a memory array region and a periphery, after processing structure 2400 of FIG. 24. A metal 2520 has been formed on the top surfaces in both the memory array region and in the periphery of structure 2400. Metal 2520 can be formed by a suitable process such as by a deposition process including but not limited to CVD, ALD, or other deposition process. Other processes can be used. Metal 2520 can be formed as W or Ru, depending on the materials selected for digit line contact 2307 and metal barrier 1614. Alternatively, as previously noted, the materials for digit line contact 2307 and metal barrier 1614 can be selected depending on the material selected for metal 2520. Metal 2520 can be formed having a thickness of about 10 nm to about 30 nm. Metal 2520 can be formed with other thicknesses. In the periphery, metal 2520 can be a metal contact to the transistor having gate 1511, where metal barrier 1614 and polysilicon region 1512 couple gate 1511 to metal 2520. In the memory array region, metal 2520 is a digit line located directly on ILD 1503 without a barrier metal, where the digit line contacts the digit line contact 2307 that is on and contacting polysilicon plug 2126 on silicon region 1506-2.

Structure 2500 can be further processed such that metal 2520 in the periphery is separated from metal 2520 in the memory array region. Structure 2500 with the separated metal 2520 has no barrier metal for the digit line in the memory array region, which is a structure similar to architecture 200 of FIG. 2. Depending on the memory device design and conductive contact architecture for the memory device, metallic materials other than those discussed above can be used in similar approaches.

Various deposition techniques for components of structures 1500-2500 in the process flow of FIGS. 15-25 can be used that are typical for the material being formed, the dimensions of the material being formed, and the architecture in which the material is being formed. Selective etching and conventional masking techniques can be used to remove selected regions in the processing discussed with respect to FIGS. 15-25. The process of FIGS. 15-25 provides a process flow for forming digit lines directly connecting to digit line contacts without a barrier metal on the dielectric on which the digit lines are routed in the memory array region of the memory device.

Figure 26:
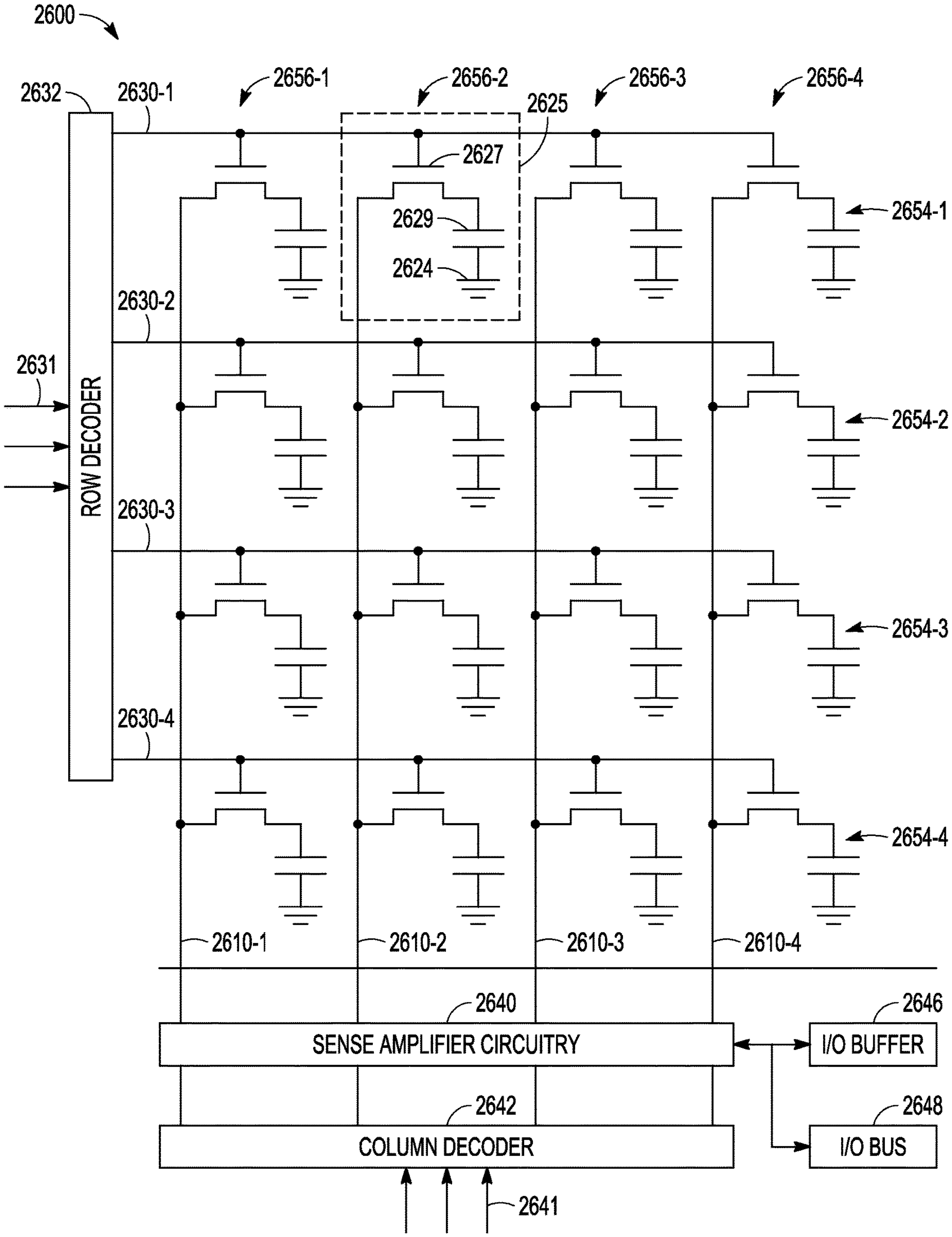
FIG. 26 is a schematic of an example dynamic random-access memory device that can include an architecture having a memory array region and a periphery to the memory array after common processing of metal digit lines in the memory array region and metal contacts in the periphery, according to various embodiments.

FIG. 26 is a schematic of an embodiment of an example DRAM device 2600 that can include an architecture having a memory array region and a periphery to the memory array after common processing of metal digit lines in the memory array region and metal contacts in the periphery. DRAM device 2600 includes an array of memory cells 2625 (only one being labeled in FIG. 26 for ease of presentation) arranged in rows 2654-1, 2654-2, 2654-3, and 2654-4 and columns 2656-1, 2656-2, 2656-3, and 2656-4. For simplicity and ease of discussion, the array is shown in only two dimensions, but the array can be extended into the third dimension. Further, while only four rows 2654-1, 2654-2, 2654-3, and 2654-4 and four columns 2656-1, 2656-2, 2656-3, and 2656-4 of four memory cells are illustrated, DRAM devices like DRAM device 2600 can have significantly more memory cells 2625 (e.g., tens, hundreds, or thousands of memory cells) per row or per column.

Each memory cell 2625 can include a single transistor 2627 and a single capacitor 2629, which is commonly referred to as a 1T1C (one-transistor-one capacitor cell). One plate of capacitor 2629, which can be termed the "node plate," is connected to the drain terminal of transistor 2627, whereas the other plate of the capacitor 2629 is connected to ground 2624. Each capacitor 2629 within the array of 1T1C cells 2625 typically serves to store one bit of data, and the respective transistor 2627 serves as an access device to write to or read from storage capacitor 2629.

The transistor gate terminal terminals within each row of rows 2654-1, 2654-2, 2654-3, and 2654-4 are portions of respective access lines 2630-1, 2630-2, 2630-3, and 2630-4 (alternatively referred to as "word lines"), and the transistor source terminals within each of columns 2656-1, 2656-2, 2656-3, and 2656-4 are electrically connected to respective digit lines 2610-1, 2610-2, 2610-3, and 2610-4 (alternatively referred to as "bit lines"). A row decoder 2632 can selectively drive the individual access lines 2630-1, 2630-2, 2630-3, and 2630-4, responsive to row address signals 2631 input to row decoder 2632. Driving a given access line at a high voltage causes the access transistors within the respective row to conduct, thereby connecting the storage capacitors within the row to the respective data lines, such that charge can be transferred between the data lines and the storage capacitors for read or write operations. Both read and write operations can be performed via sense amplifier circuitry 2640, which can transfer bit values between the memory cells 2625 of the selected row of the rows 2654-1, 2654-2, 2654-3, and 2654-4 and input/output buffers 2646 (for write/read operations) or external input/output data buses 2648.

A column decoder 2642 responsive to column address signals 2641 can select which of the memory cells 2625 within the selected row is read out or written to. Alternatively, for read operations, the storage capacitors 2629 within the selected row may be read out simultaneously and latched, and the column decoder 2642 can then select which latch bits to connect to the output data bus 2648. Since read-out of the storage capacitors destroys the stored information, the read operation is accompanied by a simultaneous rewrite of the capacitor charge. Further, in between read/write operations, the capacitor charge is repeatedly refreshed to prevent data loss. Details of read/rewrite, write, and refresh operations are well-known to those of ordinary skill in the art.

Digit lines 2610-1, 2610-2, 2610-3, and 2610-4 can be constructed as metal digit lines in a process flow with a metal contact to a device or circuit in the periphery that can include sense amplifier circuitry 2640, where the metal is the same for digit lines 2610-1, 2610-2, 2610-3, and 2610-4 and the metal contact and is formed at the same time in the fabrication process flow. Digit lines 2610-1, 2610-2, 2610-3, and 2610-4 can be structured with at most one metal barrier to each respective digit line contacts to which digit lines 2610-1, 2610-2, 2610-3, and 2610-4 are coupled, while the metal contacts in the periphery have multiple metal barriers.

DRAM device 2600 may be implemented as an integrated circuit within a package that includes pins for receiving supply voltages (e.g., to provide the source and gate voltages for the transistors 2625) and signals (including data, address, and control signals). FIG. 26 depicts DRAM device 2600 in simplified form to illustrate basic structural components, omitting many details of the memory cells 2625 and associated access lines 2630-1, 2630-2, 2630-3, and 2630-4 and digit lines 2610-1, 2610-2, 2610-3, and 2610-4 as well as the peripheral circuitry. For example, in addition to the row decoder 2631 and column decoder 2642, sense amplifier circuitry 2640, and buffers 2646, DRAM device 2600 may include further peripheral circuitry, such as a memory control unit that controls the memory operations based on control signals (provided, e.g., by an external processor), additional input/output circuitry, etc. Details of such peripheral circuitry are generally known to those of ordinary skill in the art and not further discussed herein.

In two-dimensional (2D) DRAM arrays, the rows 2654-1, 2654-2, 2654-3, and 2654-4 and columns 2656-1, 2656-2, 2656-3, and 2656-4 of memory cells 2625 are arranged along a single horizontal plane (i.e., a plane parallel to the layers) of the semiconductor substrate, e.g., in a rectangular lattice with mutually perpendicular horizontal access lines 2630-1, 2630-2, 2630-3, and 2630-4 and digit lines 2610-1, 2610-2, 2610-3, and 2610-4. In 3D DRAM arrays, the memory cells 2625 are arranged in a 3D lattice that encompasses multiple vertically stacked horizontal planes corresponding to multiple device tiers of a multi-tier substrate assembly, with each device tier including multiple parallel rows of cells 2625 whose transistor gate terminals are connected by horizontal access lines such as access lines 2630-1, 2630-2, 2630-3, and 2630-4. (A "device tier," as used herein, may include multiple layers (or levels) of materials, but forms the components of memory devices of a single horizontal tier of memory cells.) Digit lines 2610-1, 2610-2, 2610-3, and 2610-4 extend vertically through all or at least a vertical portion of the multi-tier structure, and each of the digit lines 2610-1, 2610-2, 2610-3, and 2610-4 connects to the transistor source terminals of respective vertical columns 2656-1, 2656-2, 2656-3, and 2656-4 of associated memory cells 2625 at the multiple device tiers. This 3D configuration of memory cells enables further increases in bit density compared with 2D arrays.

Figure 27:
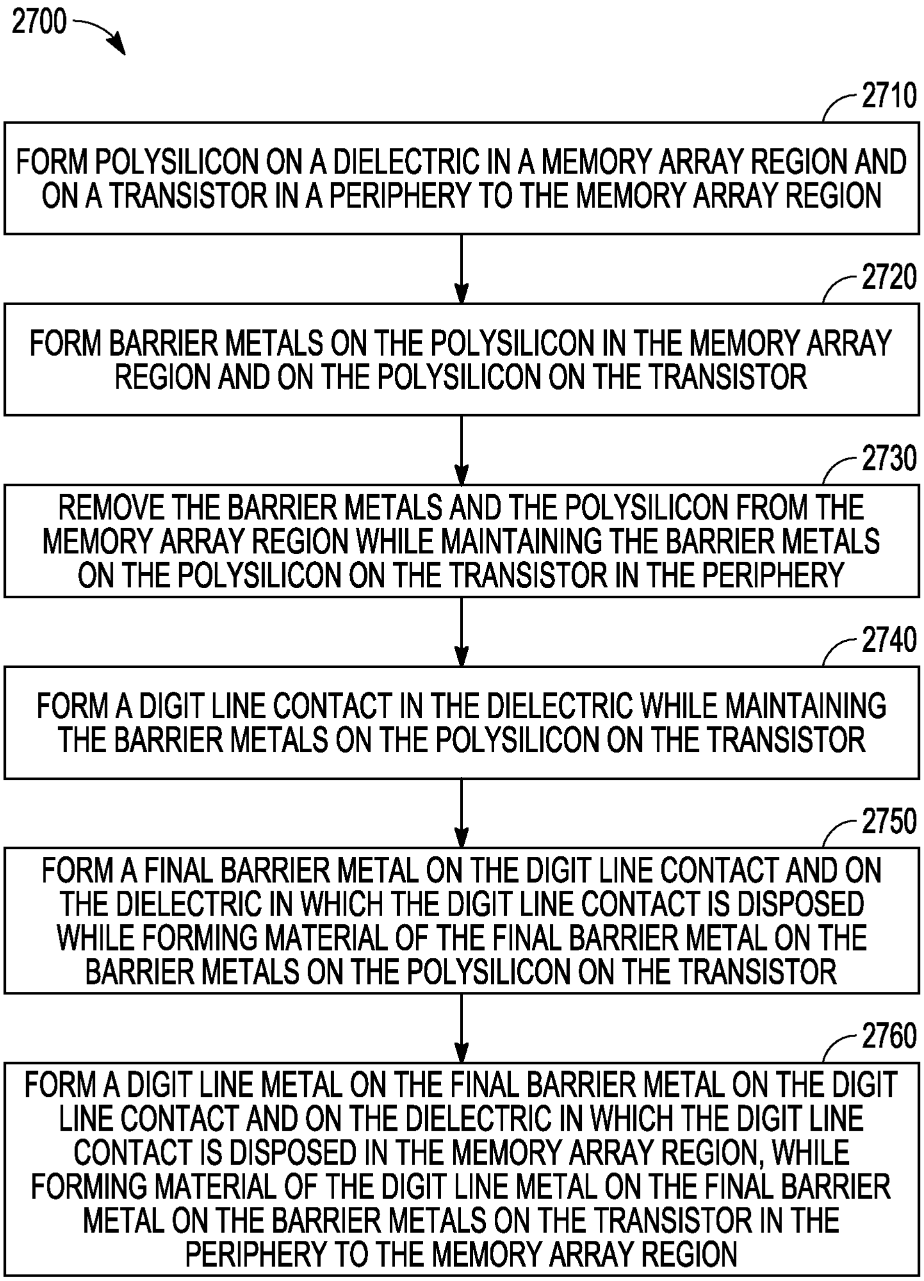
FIG. 27 is a flow diagram of features of an example method of integrating a process flow of a memory array region and a periphery to the memory array region with split barrier metal stacks, according to various embodiments.

FIG. 27 is a flow diagram of features of an embodiment of an example method 2700 of integrating a process flow of a memory array region and a periphery to the memory array region with split barrier metal stacks. At 2710, polysilicon is formed on a dielectric in a memory array region and on a transistor in a periphery to the memory array region. At 2720, barrier metals are formed on the polysilicon in the memory array region and on the polysilicon on the transistor in the periphery. At 2730, the barrier metals and the polysilicon in the memory array region are removed while maintaining the barrier metals on the polysilicon on the transistor in the periphery. At 2740, a digit line contact is formed in the dielectric while maintaining the barrier metals on the polysilicon on the transistor. At 2750, a final barrier metal is formed on the digit line contact and on the dielectric in which the digit line contact is disposed while forming material of the final barrier metal on the barrier metals on the polysilicon on the transistor. At 2760, a digit line metal is formed on the final barrier metal on the digit line contact and on the dielectric in which the digit line contact is disposed in the memory array region, while forming material of the digit line metal on the final barrier metal on the barrier metals on the transistor in the periphery to the memory array region.

Variations of method 2700 or methods similar to method 2700 can include a number of different embodiments that may be combined depending on the application of such methods and/or the architecture of systems in which such methods are implemented. Such methods can include forming titanium and tungsten nitride in the barrier metals on the polysilicon. The barrier metals can be formed as one or more layers of titanium and one or more layers of tungsten nitride. The digit line contact can be formed in the dielectric by forming one or more of titanium, tungsten nitride, or titanium nitride in the dielectric. The final barrier metal and the material of the final barrier metal on the barrier metals on the polysilicon on the transistor can be formed of tungsten silicide. Material for the digit line metal can be tungsten. The memory array region and the periphery to the memory array region formed by method 2700 can have barrier metal stacks split between a single metal barrier as a barrier metal stack contacting a tungsten digit line and multiple barrier metals as a barrier metal stack for a metal contact to a transistor in the periphery to the memory array region. For example, the single metal barrier can be $WSi_X$ and the multiple barrier metals can be $WSi_X$ on WN on Ti on polysilicon on the transistor in the periphery, where the single metal barrier and the multiple barrier metals are formed in a common process flow in which the $WSi_X$ in the memory array region and the periphery are formed at the same time. Other materials may be used for the barrier metals and digit line metal in similar processing methods.

Figure 28:
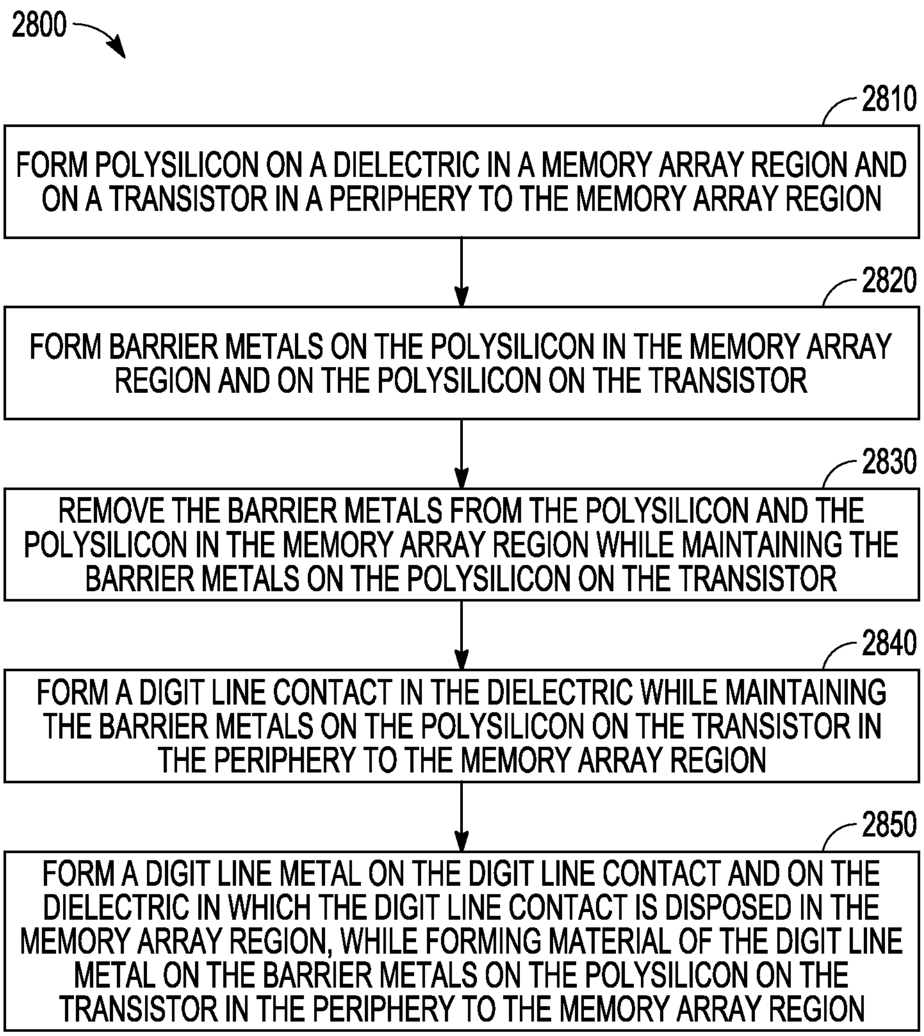
FIG. 28 is a flow diagram of features of another example method of integrating a process flow of a memory array region and a periphery to the memory array region with split barrier metal stacks, according to various embodiments.

FIG. 28 is a flow diagram of features of an embodiment of another example method 2800 of integrating a process flow of a memory array region and a periphery to the memory array region with split barrier metal stacks. At 2810, polysilicon is formed on a dielectric in a memory array region and on a transistor in a periphery to the memory array region. At 2820, barrier metals are formed on the polysilicon in the memory array region and on the polysilicon on the transistor. At 2830, the barrier metals are removed from the polysilicon and the polysilicon is removed from the memory array region while maintaining the barrier metals on the polysilicon on the transistor. At 2840, a digit line contact is formed in the dielectric while maintaining the barrier metals on the polysilicon on the transistor in the periphery to the memory array region. At 2850, a digit line metal is formed on the digit line contact and on the dielectric in which the digit line contact is disposed in the memory array region, while forming material of the digit line metal on the barrier metals on the polysilicon on the transistor in the periphery to the memory array region.

Variations of method 2800 or methods similar to method 2800 can include a number of different embodiments that may be combined depending on the application of such methods and/or the architecture of systems in which such methods are implemented. Such methods can include the memory array region and the periphery to the memory array region formed having barrier metal stacks split between no metal barrier on and between a digit line contact and a digit line and multiple barrier metals as a barrier metal stack for a metal contact to a transistor in the periphery to the memory array region, where the material for the digit line and metal contact are the same formed in the same process flow.

Variations can include forming Ti, WN, and $WSi_X$ as barriers on the polysilicon. The Ti can be formed as a layer on the poly silicon with the WN formed as a layer on the Ti layer and the $WSi_X$ formed as a layer on the WN layer. The digit line contact in the dielectric can be formed as a contact including one or more of Ti, WN, or TiN in the dielectric. The one or more of Ti, WN, or TiN can be formed in the dielectric with the Ti formed as a layer on silicon in the memory array region with the WN formed as a layer on the Ti layer, and the $WSi_X$ formed as a layer on the WN layer. The digit line metal formed can be a W digit line metal with no barrier metal between the W digit line metal and the digit line contact in the dielectric.

Variations can include forming Ti and TiN as barriers on the polysilicon, with Ru as the digit line metal. The Ti can be formed as a layer on the polysilicon with the TiN formed as a layer on the Ti layer. The digit line contact in the dielectric can be formed as a contact including one or more of Ti or TiN in the dielectric. The one or more of Ti or TiN can be formed in the dielectric with the Ti formed as a layer on silicon in the memory array region with the TiN formed as a layer on the Ti layer. The Ru digit line metal can be formed with no barrier metal between the Ru digit line metal and the digit line contact in the dielectric. Other materials may be used for the barrier metals and digit line metal in similar processing methods for barrier metal stacks split between no barrier metal on and between a digit line contact and a digit line and multiple barrier metals as a barrier metal stack for a metal contact to a transistor in the periphery to a memory array region.

The fabrication techniques used in methods 2700, 2800, or methods similar to methods 2700 and 2800 can use conventional techniques for removing material such as masking, etching, and other removal processes. The formation techniques can use conventional techniques for forming materials in semiconductor based memory devices. Formation techniques can include deposition processes such as, but not limited to, chemical vapor deposition and atomic layer deposition.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile RAM memory device, such as DRAM, mobile or low-power double-data-rate synchronous DRAM (DDR SDRAM), etc.); and a storage device (e.g., non-volatile memory (NVM) device, such as flash memory, ROM, a solid-state drive (SSD), a MultiMediaCard (MMC), or other memory card structure or assembly, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc. As used herein, "processor device" means any type of computational circuit such as, but not limited to, a microprocessor, a microcontroller, a graphics processor, a digital signal processor (DSP), or any other type of processor or processing circuit, including a group of processors or multi-core devices.

In various embodiments, a memory device can include a memory array in a memory array region and a periphery to the memory array region. A dielectric can be disposed in the memory array region with a digit line contact disposed in the dielectric. A digit line can be coupled to the digit line contact by at most one barrier metal region on the dielectric. A transistor in the periphery to the memory array region can be coupled to a metal contact on the transistor by multiple barrier metal regions on polysilicon on the transistor, where material of the metal contact is the same as material of the digit line. The material of the metal contact can be formed while forming the metal for the digit line.

Variations of such a memory device and its features, as taught herein, can include a number of different embodiments and features that may be combined depending on the application of such memory devices, the format of such memory devices, and/or the architecture in which such memory devices are implemented. Features of such memory devices can include the digit line being a W digit line, with $WSi_X$ as the one barrier metal region extending vertically from a top level of the dielectric, and the multiple barrier metal regions on the transistor can include Ti, WN, and $WSi_X$. The $WSi_X$ can extend vertically above the top level of the dielectric by about 2.5 nm and the multiple barrier metal regions combined can extend vertically above a top level of the polysilicon on the transistor by about 8 nm.

Variations of such a memory device and its features can include the digit line being a W digit line without a barrier metal region above a top level of the dielectric coupling the W digit line to the digit line contact, and the multiple barrier metal regions include Ti, WN, and $WSi_X$. The combined multiple barrier metal regions, on the transistor, extend vertically above a top level of the polysilicon by about 8 nm. Other variations of such a memory device can include the digit line being a Ru digit line without a barrier metal region above a top level of the dielectric coupling the Ru digit line to the digit line contact, and the multiple barrier metal regions include Ti and TiN.

Variations of such a memory device and its features can include the metal contact on the transistor having a top level in the periphery to the memory array region that is about twenty-six nanometers above a top level of the digit line in the memory array region. Variations can include the transistor being a CMOS transistor. Variations can include the metal contact above the CMOS transistor being coupled by the multiple barrier metal regions on the polysilicon to a high-k gate of the CMOS transistor.

Figure 29:
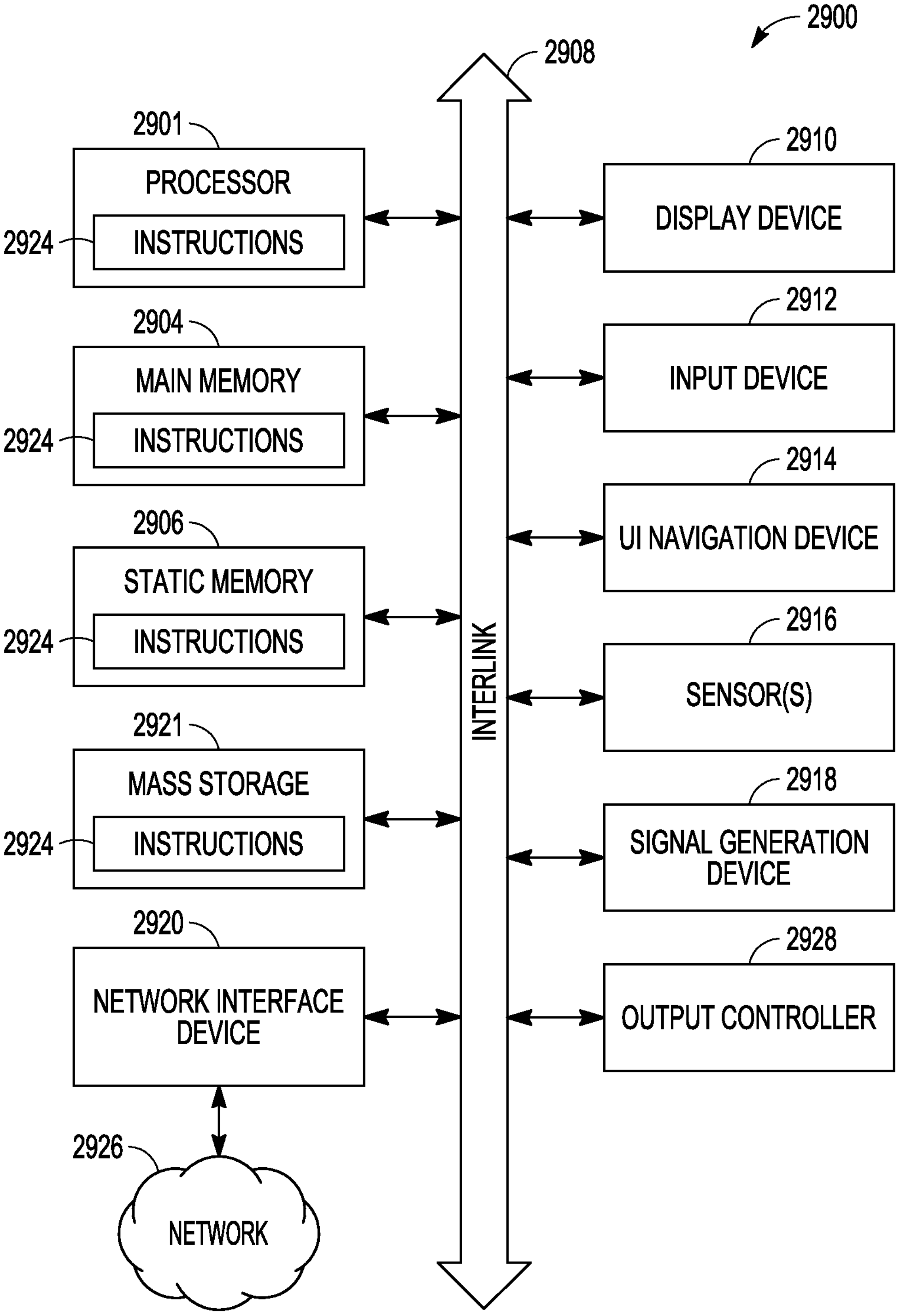
FIG. 29 is a block diagram illustrating an example of a machine upon which one or more embodiments of one or more memory components may be implemented, according to various embodiments.

FIG. 29 illustrates a block diagram of an example machine 2900 having one or more embodiments of memory components discussed herein. In alternative embodiments, machine 2900 may operate as a standalone device or may be connected (e.g., networked) to other machines. In a networked deployment, machine 2900 may operate in the capacity of a server machine, a client machine, or both in server-client network environments. In an example, machine 2900 may act as a peer machine in peer-to-peer (P2P) (or other distributed) network environment. Machine 2900 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies such as cloud computing, software as a service (SaaS), other computer cluster configurations. Example machine 2900 can include one or more memory devices having structures as discussed with respect to architecture 100 of FIG. 1 and architecture 200 of FIG. 2.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components may be used in more than one member of more than one circuitry.

Machine (e.g., computer system) 2900 may include a hardware processor 2902 (e.g., a CPU, a GPU, a hardware processor core, or any combination thereof), a main memory 2904 and a static memory 2906, some or all of which may communicate with each other via an interlink (e.g., bus) 2908. Machine 2900 may further include a display unit 2910, an alphanumeric input device 2912 (e.g., a keyboard), and a user interface (UI) navigation device 2914 (e.g., a mouse). In an example, display unit 2910, input device 2912, and UI navigation device 2914 may be a touch screen display. Machine 2900 may additionally include a mass storage (e.g., drive unit) 2921, a signal generation device 2918 (e.g., a speaker), a network interface device 2920, and one or more sensors 2916, such as a global positioning system (GPS) sensor, compass, accelerometer, or other sensor. Machine 2900 may include an output controller

2928, such as a serial (e.g., USB, parallel, or other wired or wireless (e.g., infrared (IR), near field communication (NFC), etc.) connection to communicate or control one or more peripheral devices (e.g., a printer, card reader, etc.).

Machine 2900 may include a machine readable medium on which is stored one or more sets of data structures or instructions 2924 (e.g., software) embodying or utilized by machine 2900. Instructions 2924 may also reside, completely or at least partially, within main memory 2904, within static memory 2906, within mass storage 2921, or within hardware processor 2902 during execution thereof by machine 2900. In an example, one or any combination of hardware processor 2902, main memory 2904, static memory 2906, or mass storage 2921 may constitute the machine readable medium. While the machine readable medium can be a single medium or multiple media (e.g., a centralized or distributed database, or associated caches and servers) configured to store one or more instructions 2924.

The term "machine readable medium" may include any medium that is capable of storing instructions for execution by machine 2900 and that cause machine 2900 to perform any one or more of the techniques for which machine 2900 is implemented. Non-limiting machine readable medium examples may include solid-state memories, and optical and magnetic media. Non-volatile machine readable medium may include semiconductor memory devices such as EPROM, EEPROM, and flash memory devices; magnetic disks, such as internal hard disks and removable disks; magneto-optical disks; and compact disc-ROM (CD-ROM) and digital versatile disc-read only memory (DVD-ROM) disks. Volatile machine readable medium may include (RAM), DRAM, SRAM, or SDRAM.

Instructions 2924 (e.g., software, programs, an operating system (OS), etc.) or other data stored on mass storage 2921, can be accessed by memory 2904 for use by processor 2902. Memory 2904 (e.g., DRAM) is typically fast, but volatile, and thus a different type of storage than mass storage 2921 (e.g., an SSD), which is suitable for long-term storage, including while in an "off" condition. Instructions 2924 or data in use by a user or machine 2900 are typically loaded in memory 2904 for use by processor 2902. When memory 2904 is full, virtual space from mass storage 2921 can be allocated to supplement memory 2904; however, because mass storage 2921 is typically slower than memory 2904, and write speeds are typically at least twice as slow as read speeds, use of virtual memory can greatly reduce user experience due to storage device latency (in contrast to memory 2904, e.g., DRAM). Further, use of mass storage 2921 for virtual memory can greatly reduce the usable lifespan of mass storage 2921.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, eMMC™ devices are attached to a circuit board and considered a component of the host device, with read speeds that rival SATA based SSD devices. However, demand for mobile device performance continues to increase, such as to fully enable virtual or augmented-reality devices, utilize increasing networks speeds, etc. In response to this demand, storage devices have shifted from parallel to serial communication interfaces. UFS devices, including controllers and firmware, communicate with a host device using a low-voltage differential signaling (LVDS) serial interface with dedicated read/write paths, further advancing greater read/write speeds.

Instructions 2924 may further be transmitted or received over a communications network 2926 using a transmission medium via network interface device 2920 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, network interface device 2920 may include one or more physical jacks (e.g., Ethernet, coaxial, or phone jacks) or one or more antennas to connect to the communications network 2926. In an example, network interface device 2920 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible medium that is capable of transporting instructions for execution by machine 2900, and includes digital or analog communications signals or other tangible medium to facilitate communication of such software.

The following are example embodiments of devices and methods, in accordance with the teachings herein.

An example method 1 can comprise forming polysilicon on a dielectric in a memory array region and on a transistor in a periphery to the memory array region; forming barrier metals on the polysilicon in the memory array region and on the polysilicon on the transistor; removing the barrier metals and the polysilicon from the memory array region while maintaining the barrier metals on the polysilicon on the transistor in the periphery; forming a digit line contact in the dielectric while maintaining the barrier metals on the polysilicon on the transistor; forming a final barrier metal on the digit line contact and on the dielectric in which the digit line contact is disposed while forming material of the final barrier metal on the barrier metals on the polysilicon on the transistor; and forming a digit line metal on the final barrier metal on the digit line contact and on the dielectric in which the digit line contact is disposed in the memory array region, while forming material of the digit line metal on the final barrier metal on the barrier metals on the transistor in the periphery to the memory array region.

An example method 2 can include features of example method 1 and can include forming the barrier metals on the polysilicon to include forming titanium and tungsten nitride on the poly silicon.

An example method 3 can include features of any of the preceding example methods and can include forming the digit line contact in the dielectric to include forming one or more of titanium, tungsten nitride, or titanium nitride in the dielectric.

An example method 4 can include features of any of the preceding example methods and can include forming the final barrier metal to include forming tungsten silicide.

An example method 5 can include features of example method 4 and features of any of the preceding example methods and can include forming the digit line metal to include forming tungsten as the digit line metal.

In an example method 6, any of the example methods 1 to 5 may be performed in an electronic memory apparatus further comprising a host processor and a communication bus extending between the host processor and the memory device.

In an example method 7, any of the example methods 1 to 6 may be modified to include operations set forth in any other of method examples 1 to 6.

In an example method 8, any of the example methods 1 to 7 may be implemented at least in part through use of instructions stored as a physical state in one or more machine-readable storage devices.

An example method 9 can include features of any of the preceding example methods 1 to 8 and can include performing functions associated with any features of example memory devices 1 to 14.

An example method 10 can comprise forming polysilicon on a dielectric in a memory array region and on a transistor in a periphery to the memory array region; forming barrier metals on the poly silicon in the memory array region and on the poly silicon on the transistor; removing the barrier metals from the poly silicon and the poly silicon in the memory array region while maintaining the barrier metals on the polysilicon on the transistor; forming a digit line contact in the dielectric while maintaining the barrier metals on the polysilicon on the transistor in the periphery to the memory array region; and forming a digit line metal on the digit line contact and on the dielectric in which the digit line contact is disposed in the memory array region while forming material of the digit line metal on the barrier metals on the polysilicon on the transistor in the periphery to the memory array region.

An example method 11 can include features of example method 10 and can include forming the barrier metals on the polysilicon to include forming titanium, tungsten nitride, and tungsten silicide on the polysilicon.

An example method 12 can include features of any of the preceding example methods and can include forming the barrier metals on the polysilicon to include forming titanium and titanium nitride on the polysilicon.

An example method 13 can include features of any of the preceding example methods and can include forming the digit line contact in the dielectric to include forming one or more of titanium, tungsten nitride, or titanium nitride in the dielectric.

An example method 14 can include features of example method 4 and features of any of the preceding example methods and can include forming the digit line metal to include forming tungsten as the digit line metal.

An example method 15 can include features of example method 4 and features of any of the preceding example methods and can include forming the digit line metal to include forming ruthenium as the digit line metal.

In an example method 16, any of the example methods 10 to 15 may be performed in an electronic memory apparatus further comprising a host processor and a communication bus extending between the host processor and the memory device.

In an example method 17, any of the example methods 10 to 16 may be modified to include operations set forth in any other of method examples 10 to 16.

In an example method 18, any of the example methods 1 to 16 may be modified to include operations set forth in any other of method examples 1 to 16.

In an example method 19, any of the example methods 10 to 17 may be implemented at least in part through use of instructions stored as a physical state in one or more machine-readable storage devices.

An example method 20 can include features of any of the preceding example methods 10 to 18 and can include performing functions associated with any features of example memory devices 1 to 14.

An example memory device 1 can comprise: a memory array region; a dielectric disposed in the memory array region; a digit line contact disposed in the dielectric; a digit line coupled to the digit line contact by at most one barrier metal region; and a transistor in a periphery to the memory array region, the transistor coupled to a metal contact on the transistor by multiple barrier metal regions on polysilicon on the transistor, material of the metal contact being the same as material of the digit line.

An example memory device 2 can include features of example memory device 1 and can include the digit line being a tungsten digit line, the at most one barrier metal region to include tungsten silicide vertically extending from a top level of the dielectric, and the multiple barrier metal regions to include titanium, tungsten nitride, and tungsten silicide.

An example memory device 3 can include features of example memory device 2 and any features of the preceding example memory devices and can include the tungsten silicide extending vertically above the top level of the dielectric by about 2.5 nm and the multiple barrier metal regions combined extending vertically above a top level of the polysilicon by about 8 nm.

An example memory device 4 can include features of any of the preceding example memory devices and can include the digit line being a tungsten digit line without a barrier metal region above a top level of the dielectric coupling the tungsten digit line to the digit line contact, and the multiple barrier metal regions to include titanium, tungsten nitride, and tungsten silicide.

An example memory device 5 can include features of example memory device 4 and any features of the preceding example memory devices and can include the multiple barrier metal regions combined extending vertically above a top level of the polysilicon by about 8 nm.

An example memory device 6 can include features of any of the preceding example memory devices and can include the digit line being a ruthenium digit line without a barrier metal region above a top level of the dielectric coupling the ruthenium digit line to the digit line contact, and the multiple barrier metal regions to include titanium and titanium nitride.

An example memory device 7 can include features of any of the preceding example memory devices and can include the metal contact on the transistor having a top level in the periphery to the memory array region that is about twenty-six nm above a top level of the digit line in the memory array region.

An example memory device 8 can include features of any of the preceding example memory devices and can include the transistor being a complementary metal oxide semiconductor (CMOS) transistor.

An example memory device 9 can include features of example memory device 8 and any features of the preceding example memory devices and can include the metal contact on the CMOS transistor being coupled by the multiple barrier metal regions on the polysilicon to a high-k gate of the CMOS transistor.

In an example memory device 10, any of the memory devices of example memory devices 1 to 9 may include memory devices incorporated into an electronic memory apparatus further comprising a host processor and a communication bus extending between the host processor and the memory device.

In an example memory device 11, any of the memory devices of example memory devices 1 to 10 may be modified to include any structure presented in another of example memory device 1 to 10.

In an example memory device 12, any of the memory devices of example memory devices 1 to 11 may be modified to include any structure presented in another of example memory device 1 to 11.

In an example memory device 13, any apparatus associated with the memory devices of example memory devices 1 to 12 may further include a machine-readable storage device configured to store instructions as a physical state, wherein the instructions may be used to perform one or more operations of the apparatus.

In an example memory device 14, any of the memory devices of example memory devices 1 to 13 may be operated in accordance with any of the methods of the above example methods 1 to 18.

An example machine-readable storage device 1 storing instructions, that when executed by one or more processors, cause a machine to perform operations, can comprise instructions to perform functions associated with any features of example memory devices 1 to 10 and memory devices 11 to 23 or perform methods associated with any features of example methods 1 to 10.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. A method comprising:

forming polysilicon on a dielectric in a memory array region and on a transistor in a periphery to the memory array region;

forming barrier metals on the polysilicon in the memory array region and on the polysilicon on the transistor;

removing the barrier metals and the polysilicon in the memory array region while maintaining the barrier metals on the polysilicon on the transistor in the periphery;

forming a digit line contact in the dielectric while maintaining the barrier metals on the polysilicon on the transistor;

forming a final barrier metal on the digit line contact and on the dielectric in which the digit line contact is disposed while forming material of the final barrier metal on the barrier metals on the polysilicon on the transistor; and forming a digit line metal on the final barrier metal on the digit line contact and on the dielectric in which the digit line contact is disposed in the memory array region, while forming material of the digit line metal on the final barrier metal on the barrier metals on the transistor in the periphery to the memory array region.

2. The method of claim 1, wherein forming the barrier metals on the polysilicon includes forming titanium and tungsten nitride on the polysilicon.

3. The method of claim 1, wherein forming the digit line contact in the dielectric includes forming one or more of titanium, tungsten nitride, or titanium nitride in the dielectric.

4. The method of claim 1, wherein forming the final barrier metal includes forming tungsten silicide.

5. The method of claim 1, wherein forming the digit line metal includes forming tungsten as the digit line metal.

6. A method comprising:

forming polysilicon on a dielectric in a memory array region and on a transistor in a periphery to the memory array region;

forming barrier metals on the polysilicon in the memory array region and on the polysilicon on the transistor;

removing the barrier metals from the polysilicon and the polysilicon in the memory array region while maintaining the barrier metals on the polysilicon on the transistor;

forming a digit line contact in the dielectric while maintaining the barrier metals on the polysilicon on the transistor in the periphery to the memory array region; and forming a digit line metal on the digit line contact and on the dielectric in which the digit line contact is disposed in the memory array region, while forming material of the digit line metal on the barrier metals on the polysilicon on the transistor in the periphery to the memory array region.

7. The method of claim 6, wherein forming the barrier metals on the polysilicon includes forming titanium, tungsten nitride, and tungsten silicide on the polysilicon.

8. The method of claim 6, wherein forming the barrier metals on the polysilicon includes forming titanium and titanium nitride on the polysilicon.

9. The method of claim 6, wherein forming the digit line contact in the dielectric includes forming one or more of titanium, tungsten nitride, or titanium nitride in the dielectric.

10. The method of claim 6, wherein forming the digit line metal includes forming tungsten as the digit line metal.

11. The method of claim 6, wherein forming the digit line metal includes forming ruthenium as the digit line metal.

* * * * *